(12) United States Patent
Sanekata et al.

(10) Patent No.: US 10,679,334 B2
(45) Date of Patent: *Jun. 9, 2020

(54) ELECTRONIC COMPONENT HANDLER AND ELECTRONIC COMPONENT TESTER

(71) Applicant: Seiko Epson Corporation, Tokyo (JP)

(72) Inventors: Takahito Sanekata, Shiojiri (JP); Hirokazu Ishida, Matsumoto (JP); Daisuke Ishida, Chino (JP)

(73) Assignee: Seiko Epson Corporation (JP)

( * ) Notice: Subject to any disclaimer, the term of this patent is extended or adjusted under 35 U.S.C. 154(b) by 72 days.

This patent is subject to a terminal disclaimer.

(21) Appl. No.: 16/021,545

(22) Filed: Jun. 28, 2018

(65) Prior Publication Data

US 2019/0005639 A1  Jan. 3, 2019

(30) Foreign Application Priority Data

Jun. 29, 2017  (JP) ................................ 2017-127044

(51) Int. Cl.
 *G06T 7/00* (2017.01)
 *H01L 21/67* (2006.01)
 (Continued)

(52) U.S. Cl.
 CPC ........ *G06T 7/0008* (2013.01); *G01R 31/2867* (2013.01); *G01R 31/2893* (2013.01); *G06F 3/147* (2013.01); *G06T 7/001* (2013.01); *H01L 21/67265* (2013.01); *H01L 21/67333* (2013.01); *G06F 3/14* (2013.01); *G06T 2200/32* (2013.01); *G06T 2207/10016* (2013.01); *G06T 2207/20212* (2013.01); *G06T 2207/30148* (2013.01)

(58) Field of Classification Search
 USPC ...................................... 324/750.22, 750.23
 See application file for complete search history.

(56) References Cited

U.S. PATENT DOCUMENTS 5,394,100 A * 2/1995 Bohler ............... G01R 1/07314
 324/750.23
6,245,660 B1  6/2001 Sumitani
 (Continued)

FOREIGN PATENT DOCUMENTS

CN  101180549 A  5/2008
CN  101937055 A  1/2011
 (Continued)

*Primary Examiner* — Vincent Q Nguyen
(74) *Attorney, Agent, or Firm* — Harness, Dickey & Pierce, P.L.C.

(57) ABSTRACT

An electronic component handler includes a region where an electronic component placing unit on which an electronic component is placed is capable of being disposed. A transport unit includes a first hand and a second hand for holding and transporting the electronic component. A light irradiation unit is capable of emitting light toward the electronic component placing unit and is capable of adjusting an emitting direction of the light. A capturing unit is capable of capturing an image of the electronic component placing unit irradiated with the light via a space between the first hand and the second hand. A control unit performs determination processing about the presence or absence of the electronic component in the electronic component placing unit based on the image captured by the capturing unit.

10 Claims, 33 Drawing Sheets

(51) Int. Cl.
*H01L 21/673* (2006.01)
*G01R 31/28* (2006.01)
*G06F 3/147* (2006.01)
*G06F 3/14* (2006.01)

(56) References Cited

U.S. PATENT DOCUMENTS

| | | |
|---|---|---|
| 7,921,997 B2 | 4/2011 | Burns |
| 2004/0022677 A1 | 2/2004 | Wohlstadter et al. |
| 2009/0136118 A1 | 5/2009 | Ichikawa |
| 2010/0329586 A1 | 12/2010 | Stellari et al. |
| 2011/0292233 A1 | 12/2011 | Chu et al. |
| 2014/0184784 A1 | 7/2014 | Yanase |
| 2016/0178512 A1 | 6/2016 | Hall et al. |
| 2017/0045577 A1 | 2/2017 | Ding et al. |

FOREIGN PATENT DOCUMENTS

| | | |
|---|---|---|
| CN | 102263926 A | 11/2011 |
| CN | 103620482 A | 3/2014 |
| CN | 106829359 A | 6/2017 |
| JP | 2014-196908 A | 10/2014 |
| TW | 469482 B | 12/2001 |
| TW | M414656 U1 | 10/2011 |
| TW | 201708834 A | 3/2017 |

\* cited by examiner

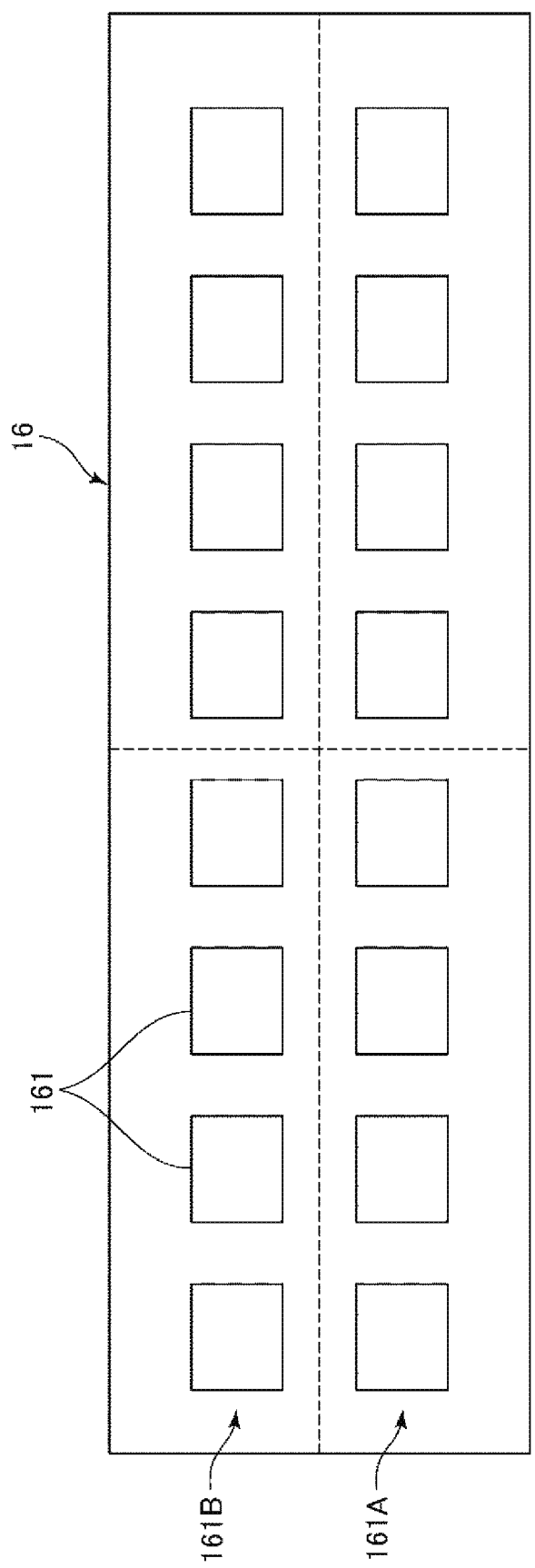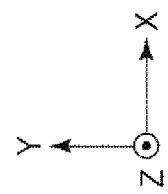
FIG.18

ELECTRONIC COMPONENT HANDLER AND ELECTRONIC COMPONENT TESTER

BACKGROUND

1. Technical Field

The present invention relates to an electronic component handler and an electronic component tester.

2. Related Art

From the related art, there has been known a tester that electrically tests electronic components, such as an IC device (for example, refer to JP-A-2014-196908). In the tester described in JP-A-2014-196908, when performing a test on the IC device, the IC device is transported to a test socket, placed on a test socket, and tested. Further, in the tester described in JP-A-2014-196908, it is determined whether or not the IC device remains in the test socket, that is, the presence or absence of the IC device, prior to performing the test on the IC device. The determination is necessary, because, for example, in a case where the IC device remains in the test socket, the IC device to be tested will overlap the remaining device and there is a concern that an accurate test result cannot be obtained. In addition, in the tester described in JP-A-2014-196908, in a state where the test socket is irradiated with slit light, two images having different capturing timing (before and after transporting the IC device) are obtained, the difference (image difference) of the two images is detected, and the determination on the presence or absence of the IC device is performed based on the detection result.

However, in the tester described in JP-A-2014-196908, in a case where the capturing range is limited due to design restrictions or the like, the capturing range becomes relatively narrow. Therefore, it is difficult to grasp what kind of phenomenon occurs in the test socket from the image obtained as described above.

SUMMARY

An advantage of some aspects of the invention is to solve at least a part of the problems described above, and the invention can be implemented as the following configurations.

An electronic component handler according to an aspect of the invention includes: a region where an electronic component placing unit on which an electronic component is placed is capable of being disposed; a transport unit having a first hand and a second hand for holding and transporting the electronic component; a light irradiation unit which is capable of emitting light toward the electronic component placing unit and capable of adjusting an emitting direction of the light; a capturing unit which is capable of capturing an image of the electronic component placing unit irradiated with the light via a space between the first hand and the second hand; a display unit which displays the image captured by the capturing unit; and a control unit which controls the transport unit, the light irradiation unit, and the capturing unit, and performs determination processing about the presence or absence of the electronic component in the electronic component placing unit based on the image captured by the capturing unit, in which the capturing unit captures a first image when the transport unit is positioned at a first position and captures a second image when the transport unit is positioned at a second position different from the first position, and in which the control unit displays the first image and the second image on the display unit.

In the configuration in which the capturing is performed between the first hand and the second hand, it is difficult to capture the entire area of the electronic component placing unit, and the capturing range is relatively narrow. In the aspect of the invention, the first image obtained by capturing the electronic component placing unit when the transport unit is positioned at the first position and the second image obtained by capturing the electronic component placing unit when the transport unit is positioned at the second position different from the first position, are displayed on the display unit. Accordingly, it is possible to display an image in a wider range of the electronic component placing unit on the display unit. Therefore, the operator can confirm the wider range of the electronic component placing unit.

In the electronic component handler according to the aspect of the invention, it is preferable that the control unit displays a composite image obtained by composing the first image and the second image on the display unit.

With this configuration, it is possible to display an image in a wider range of the electronic component placing unit as the composite image on the display unit. Therefore, the operator can confirm the wider range of the electronic component placing unit clearly and efficiently.

In the electronic component handler according to the aspect of the invention, it is preferable that the light has an elongated irradiation shape, and the composite image is a combination of the first image and the second image along a longitudinal direction of the irradiation shape in the first image and the second image.

With this configuration, the operator can confirm the wider range of the electronic component placing unit clearly and efficiently.

In the electronic component handler according to the aspect of the invention, it is preferable that the control unit displays the first image and the second image side by side on the display unit separately.

With this configuration, it is possible to display an image in a wider range of the electronic component placing unit on the display unit. Therefore, the operator can confirm the wider range of the electronic component placing unit.

In the electronic component handler according to the aspect of the invention, it is preferable that, in a case where the same part of the electronic component placing unit is taken in the first image and the second image, the control unit removes the same part from any of the first image and the second image and displays the images.

With this configuration, for example, it is possible to display the image in a state where an unnecessary part is removed on the display unit. Therefore, a situation of the electronic component placing unit can be displayed to the operator more easily.

In the electronic component handler according to the aspect of the invention, it is preferable that, in a case where the same part of the electronic component placing unit is taken in the first image and the second image, the control unit removes the same part from both of the first image and the second image and displays the images.

With this configuration, for example, it is possible to display the image in a state where an unnecessary part is removed on the display unit. Therefore, a situation of the electronic component placing unit can be displayed to the operator more easily.

In the electronic component handler according to the aspect of the invention, it is preferable that the electronic component placing unit includes a plurality of recess portions arranged in rows and columns to accommodate the electronic component therein, and the first image and the second image are respectively images obtained by capturing different rows out of the rows of the recess portions.

With this configuration, it is possible to display images of rows different from each other of the recess portion on the display unit.

In the electronic component handler according to the aspect of the invention, it is preferable that the display on the display unit is performed prior to the determination processing.

With this configuration, it is possible to accurately detect the presence or absence of electronic components in the electronic component placing unit.

In the electronic component handler according to the aspect of the invention, it is preferable that the electronic component placing unit is a test unit which is capable of testing the electronic component placed thereon.

With this configuration, the operator can confirm the wider range of the test unit clearly and efficiently. Therefore, in a case where it is detected that the electronic component is unintentionally remaining in the test unit, the operator can confirm the test unit more widely, and can more clearly know the situation of the test unit. As a result, it is possible to observe the test unit more widely, and to deal with the abnormality promptly. Therefore, this contributes to improvement of throughput.

An electronic component tester according to another aspect of the invention includes: a region where an electronic component placing unit on which an electronic component is placed is capable of being disposed; a transport unit having a first hand and a second hand for transporting the electronic component; a light irradiation unit which is capable of emitting light toward the electronic component placing unit and capable of adjusting an emitting direction of the light; a capturing unit which is capable of capturing an image of the electronic component placing unit irradiated with the light via a space between the first hand and the second hand; a display unit which displays the image captured by the capturing unit; and a control unit which controls the transport unit, the light irradiation unit, and the capturing unit, and performs determination processing about the presence or absence of the electronic component in the electronic component placing unit based on the image captured by the capturing unit, in which the capturing unit captures a first image when the transport unit is positioned at a first position and captures a second image when the transport unit is positioned at a second position different from the first position, in which the control unit displays the first image and the second image on the display unit, and in which the electronic component placing unit is a test unit which is capable of testing the electronic component placed thereon.

In the configuration in which the capturing is performed between the first hand and the second hand, it is difficult to capture the entire area of the electronic component placing unit, and the capturing range is relatively narrow. In the aspect of the invention, the first image obtained by capturing the electronic component placing unit when the transport unit is positioned at the first position and the second image obtained by capturing the electronic component placing unit when the transport unit is positioned at the second position different from the first position, are displayed on the display unit. Accordingly, it is possible to display an image in a wider range of the electronic component placing unit on the display unit. Therefore, the operator can confirm the wider range of the electronic component placing unit.

BRIEF DESCRIPTION OF THE DRAWINGS

The invention will be described with reference to the accompanying drawings, wherein like numbers reference like elements.

FIG. 18 is a plan view of the test unit illustrated in FIG. 2.

DESCRIPTION OF EXEMPLARY EMBODIMENTS

Hereinafter, an electronic component handler and an electronic component tester according to the invention will be described in detail based on appropriate embodiments illustrated in the attached drawings.

First Embodiment

Figure 1:
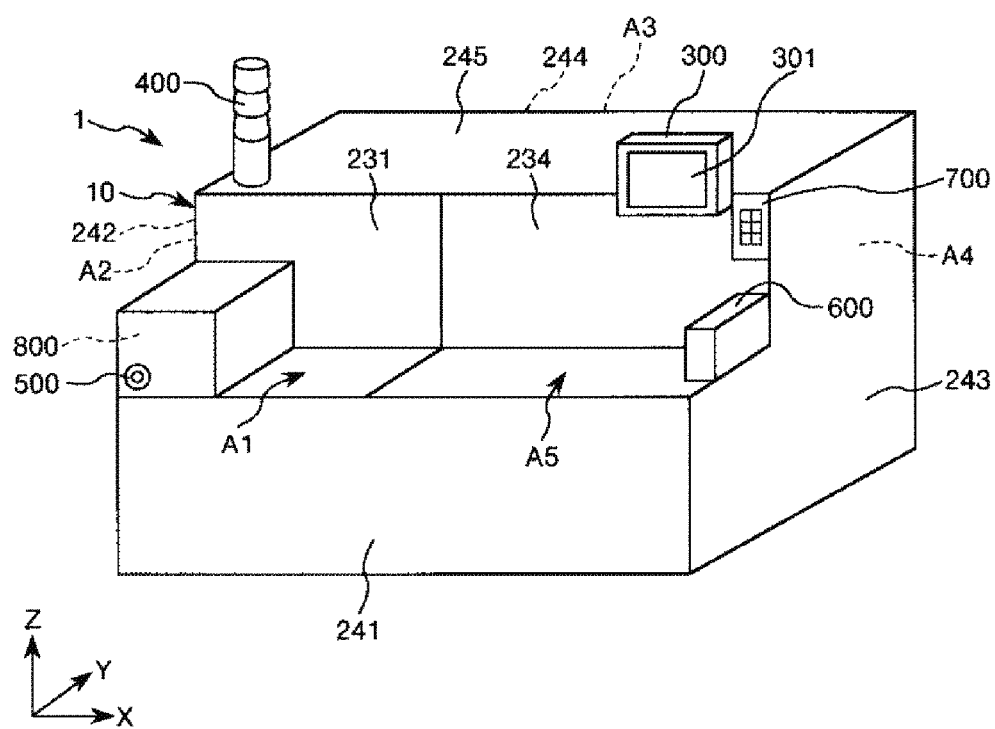
FIG. 1 is a schematic perspective view when a first embodiment of an electronic component tester according to the invention is viewed from a front side.

Hereinafter, a first embodiment of the electronic component handler and the electronic component tester according to the invention will be described with reference to FIGS. 1 to 20. In addition, hereinafter, for the convenience of the description, as illustrated in FIG. 1, three axes which are orthogonal to each other are an X-axis, a Y-axis, and a Z-axis. In addition, an XY plane including the X-axis and the Y-axis is horizontal, and the Z-axis is perpendicular. In addition, a direction parallel to the X-axis is also referred to as "X direction (first direction)", a direction parallel to the Y-axis is also referred to as "Y direction (second direction)", and a direction parallel to the Z-axis is also referred to as "Z direction (third direction)". In addition, a direction in which arrows of each direction are oriented is "positive", and a direction opposite thereto is "negative". In addition, "horizontal" referred in the specification is not limited to a complete horizontal state, and also includes a state of being slightly (for example, a degree which is less than 5°) inclined with respect to the horizontal state as long as transport of an electronic component is not interrupted. In addition, an upper side, that is, a positive side in the Z-axis direction in FIGS. 1, 4, 5, 6, and 14 to 17 is referred to as "up" or "upper part", and a lower side, that is, a negative side in the Z-axis direction is referred to as "down" or "lower part".

An electronic component handler 10 according to the invention has an external appearance illustrated in FIG. 1. The electronic component handler 10 according to the invention includes: a test region A3 (region) where a test unit 16 which is an electronic component placing unit on which an electronic component is placed is capable of being disposed; a device transport head 17 (transport unit) having a device transport head 17A (first hand) and a device transport head 17B (second hand) for holding and transporting the electronic component; a light irradiation unit 4 which is capable of emitting light toward the test unit 16 (electronic component placing unit) and capable of adjusting an emitting direction of the light; a capturing unit 3 which is capable of capturing the test unit 16 irradiated with the light via a space between the device transport head 17A and the device transport head 17B; a monitor 300 that serves as a display unit which displays an image captured by the capturing unit 3; and a control unit 800 that serves as a processor which performs determination processing about the presence or absence of the electronic component in the test unit 16 based on the image captured by the capturing unit 3 and controls the device transport head 17, the light irradiation unit 4, and the capturing unit 3. In addition, the capturing unit 3 captures an image d1 (first image) when the device transport head 17 is positioned at a first position P1, and an image d2 (second image) when the device transport head 17 is positioned at a second position P2 different from the first position P1. In addition, the control unit 800 displays the image d1 and the image d2 on the monitor 300.

In the configuration in which the capturing is performed via the space between the device transport head 17A and the device transport head 17B, it is difficult to capture the entire area of the test unit 16, and the capturing range is relatively narrow. In the configuration according to the invention, the image d1 obtained by capturing the test unit 16 when the device transport head 17 is positioned at the first position P1 and the image d2 obtained by capturing the test unit 16 when the device transport head 17 is positioned at the second position P2, are displayed on the monitor 300. Accordingly, it is possible to display an image in a wider range of the test unit 16 on the monitor 300. Therefore, the operator can confirm the wider range of the test unit 16.

Figure 2:
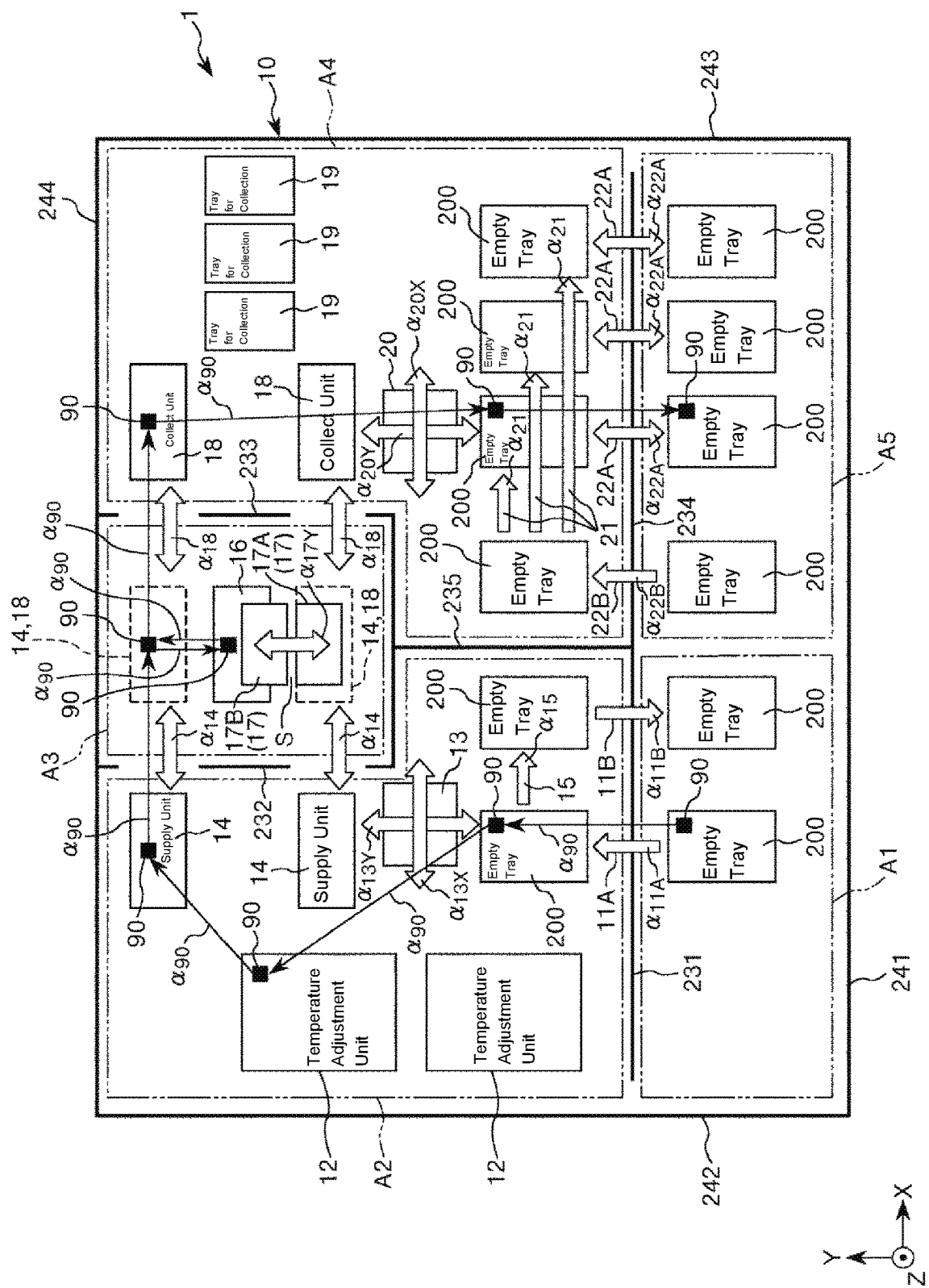
FIG. 2 is a schematic plan view illustrating an operation state of the electronic component tester illustrated in FIG. 1.

In addition, as illustrated in FIG. 2, an electronic component tester 1 according to the invention includes: the test region A3 (region) where the test unit 16 which is the electronic component placing unit on which the electronic component is placed is capable of being disposed; the device transport head 17 (transport unit) having the device transport head 17A (first hand) and the device transport head 17B (second hand) for holding and transporting the electronic component; the light irradiation unit 4 which is capable of emitting light toward the test unit 16 (electronic component placing unit) and capable of adjusting the emitting direction of the light; the capturing unit 3 which is capable of capturing the test unit 16 irradiated with the light via the space between the device transport head 17A and the device transport head 17B; the monitor 300 that serves as the display unit which displays the image captured by the capturing unit 3; and the control unit 800 that serves as the processor which performs determination processing about the presence or absence of the electronic component in the test unit 16 based on the image captured by the capturing unit 3 and controls the device transport head 17, the light irradiation unit 4, and the capturing unit 3. In addition, the capturing unit 3 captures an image d1 (first image) when the device transport head 17 is positioned at the first position P1, and an image d2 (second image) when the device transport head 17 is positioned at the second position P2 different from the first position P1. In addition, the control unit 800 displays the image d1 and the image d2 on the monitor 300. As described above, the electronic component placing unit is the test unit 16 that can test the electronic components placed thereon.

Accordingly, the electronic component tester 1 having an advantage of the above-described electronic component handler 10 is obtained. In addition, it is possible to transport the electronic component to the test unit 16, and thus, to perform the test with respect to the electronic component by the test unit 16. In addition, it is possible to transport the electronic component after the test from the test unit 16.

Hereinafter, configurations of each portion will be described.

As illustrated in FIGS. 1 and 2, the electronic component tester 1 having the electronic component handler 10 embedded therein is an apparatus which transports the electronic component, such as an IC device, which is a ball grid array (BGA) package, and inspects and tests (hereinafter, simply referred to as "test") electric characteristics of the electronic component in the transport process. In addition, hereinafter, for the convenience of the description, a case where the IC device which functions as the electronic component is used will be described as a representative example, and this will be referred to as "IC device 90".

In addition to the description above, examples of the IC device include "large scale integration (LSI)", "complementary MOS (CMOS)", "charge coupled device (CCD)", "module IC" in which the plurality of IC devices are made as a module package, "quartz device", "pressure sensor", "inertial sensor (acceleration sensor)", "gyro sensor", and "fingerprint sensor".

In addition, the electronic component tester 1 (electronic component handler 10) is used while a so-called "change kit" which is exchanged for each type of the IC device 90 is loaded in advance. In the change kit, there is a placing unit on which the IC device 90 is placed, and the placing unit includes, for example, a temperature adjustment unit 12, a device supply unit 14, and the like which will be described later. In addition, as the placing unit on which the IC device 90 is placed, in addition to the change kit described above, there are also the test unit 16 or a tray 200 which will be prepared by a user.

The electronic component tester 1 includes a tray supply region A1, a device supply region (hereinafter, simply referred to as "supply region") A2, a test region A3, a device collect region (hereinafter, simply referred to as "collect region") A4, and a tray remove region A5, and the regions are divided by each of wall portions as will be described later. In addition, the IC device 90 is tested in the test region A3 in the middle of the path via each of the regions from the tray supply region A1 to the tray remove region A5 in order in an arrow $\alpha_{90}$ direction. In this manner, the electronic component tester 1 includes a handler that is the electronic component handler 10 which transports the IC device 90 via each of the regions, the test unit 16 which performs the test in the test region A3, and the control unit 800. In addition to this, the electronic component tester 1 includes a monitor 300, a signal lamp 400, and an operation panel 700.

In addition, the electronic component tester 1 is used while a part at which the tray supply region A1 and the tray remove region A5 are disposed, that is, a lower side in FIG. 2 is a front side, and a part in which the test region A3 is disposed, that is, an upper side in FIG. 2 is a rear side.

The tray supply region A1 is a material supply unit by which the tray 200 on which the plurality of IC devices 90 in a state of not being tested are arranged is supplied. In the tray supply region A1, it is possible to stack multiple trays 200.

The supply region A2 is a region through which the plurality of IC devices 90 on the tray 200 transported from the tray supply region A1 are respectively transported and supplied to the test region A3. In addition, tray transport mechanisms 11A and 11B which transport the trays 200 in the horizontal direction one by one are provided to go across the tray supply region A1 and the supply region A2. The tray transport mechanism 11A is a moving unit which moves the tray 200 to the positive side in the Y direction for each of the IC devices 90 placed on the tray 200, that is, in an arrow $\alpha_{11A}$ direction in FIG. 2. Accordingly, it is possible to stably send the IC device 90 into the supply region A2. In addition, the tray transport mechanism 11B is a moving unit which can move the empty tray 200 to the negative side in the Y direction, that is, in an arrow $\alpha_{11B}$ direction in FIG. 2. Accordingly, it is possible to move the empty tray 200 from the supply region A2 to the tray supply region A1.

In the supply region A2, the temperature adjustment unit (soak plate) 12, a device transport head 13, and a tray transport mechanism 15, are provided.

The temperature adjustment unit 12 is a placing unit on which the plurality of IC devices 90 are placed, and is called "soak plate" which can collectively heat or cool the placed IC device 90. By using the soak plate, it is possible to heat or cool the IC device 90 before the test by the test unit 16 in advance, and to adjust the temperature to the temperature appropriate for the test (high temperature test or low temperature test). In the configuration illustrated in FIG. 2, two temperature adjustment units 12 are disposed and fixed in the Y direction. In addition, the IC device 90 on the tray 200 transported from the tray supply region A1 by the tray transport mechanism 11A is transported to any of the temperature adjustment units 12. In addition, as the temperature adjustment unit 12 which functions as the placing unit is fixed, it is possible to stably adjust the temperature with respect to the IC device 90 on the temperature adjustment unit 12.

The device transport head 13 is supported to be movable in the X direction and in the Y direction in the supply region A2, and further has a part that can also move in the Z direction. Accordingly, the device transport head can transport the IC device 90 between the tray 200 transported from the tray supply region A1 and the temperature adjustment unit 12 and transport the IC device 90 between the temperature adjustment unit 12 and the device supply unit 14 which will be described later. In addition, in FIG. 2, the movement of the device transport head 13 in the X direction is illustrated as an arrow $\alpha_{13x}$, and the movement of the device transport head 13 in the Y direction is illustrated as an arrow $\alpha_{13y}$.

The tray transport mechanism 15 is a mechanism which transports the empty tray 200 in a state where all of the IC devices 90 are removed to the positive side in the X direction in the supply region A2, that is, in an arrow $\alpha_{15}$ direction. In addition, after the transport, the empty tray 200 returns to the tray supply region A1 from the supply region A2 by the tray transport mechanism 11B.

The test region A3 is a region in which the IC device 90 is tested. In the test region A3, the test unit 16 which performs the test with respect to the IC device 90, and the device transport head 17 are provided. In addition, the device supply unit 14 which moves so as to go across the supply region A2 and the test region A3 and a device collect unit 18 which moves so as to go across the test region A3 and the collect region A4 are also provided.

The device supply unit 14 is configured as the placing unit on which the IC device 90 of which the temperature is adjusted by the temperature adjustment unit 12 is placed, and is also called "shuttle plate for supply" or simply "supply shuttle" which can transport the IC device 90 to the vicinity of the test unit 16.

In addition, the device supply unit 14 that serves as the placing unit is supported to be capable of reciprocating between the supply region A2 and the test region A3 along the X direction, that is, along an arrow $\alpha_{14}$ direction. Accordingly, the device supply unit 14 can stably transport the IC device 90 from the supply region A2 to the vicinity of the test unit 16 of the test region A3, and can return to the supply region A2 again after the IC device 90 is removed by a device transport head 17 in the test region A3.

In the configuration illustrated in FIG. 2, two device supply units 14 are arranged in the Y direction, and the IC device 90 on the temperature adjustment unit 12 is transported to any of the device supply units 14. In addition, similar to the temperature adjustment unit 12, the device supply unit 14 is configured to be capable of heating or cooling the IC device 90 placed on the device supply unit 14. Accordingly, it is possible to maintain the temperature adjustment state of the IC device 90 of which the temperature is adjusted by the temperature adjustment unit 12, and to transport the IC device 90 to the vicinity of the test unit 16 of the test region A3.

The device transport head 17 is an operation unit which holds the IC device 90 maintained in the temperature adjustment state, and transports the IC device 90 in the test region A3. The device transport head 17 is a part of a mechanism which is supported to be capable of reciprocating in the Y direction and in the Z direction in the test region A3, and is called "index arm". Accordingly, the device transport head 17 can transport and place the IC device 90 on the device supply unit 14 transported from the supply region A2 onto the test unit 16. In addition, in FIG. 2, the reciprocating movement of the device transport head 17 in the Y direction is illustrated by an arrow ally. In addition, the device transport head 17 is supported to be capable of reciprocating in the Y direction, but not being limited thereto, the device transport head 17 may also be supported to be capable of reciprocating in the X direction.

Figure 16:
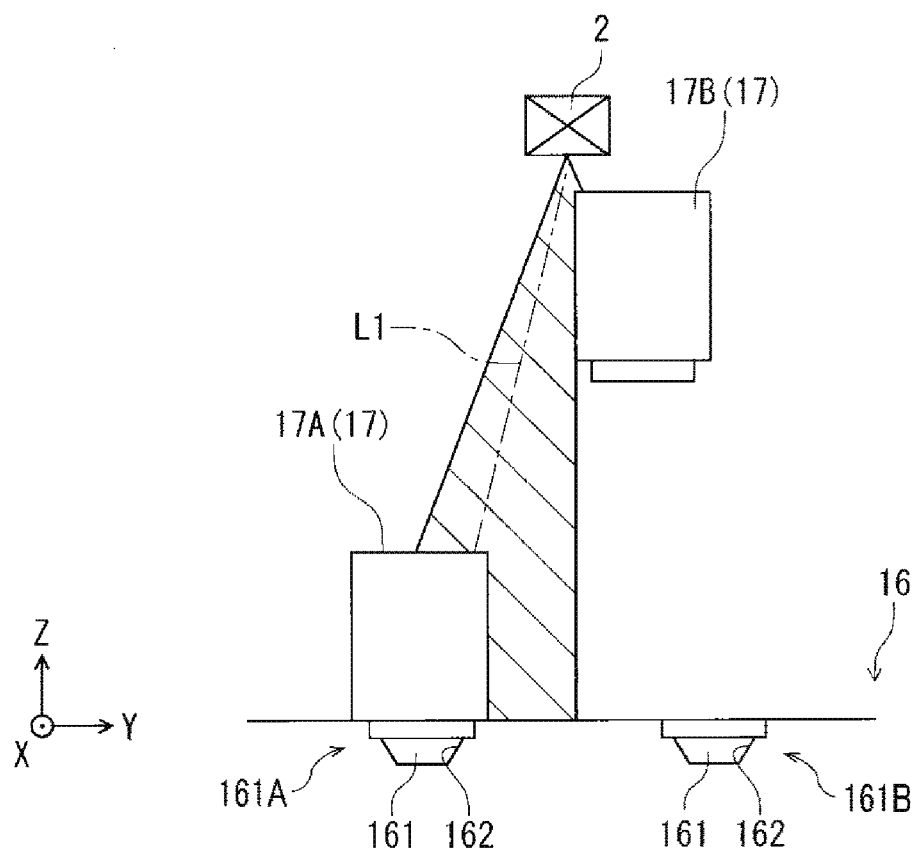
FIG. 16 is a side view of the device transport head of the electronic component tester illustrated in FIG. 1, and is a view for describing the positional relationship between the device transport head and the detection unit.
Figure 17:
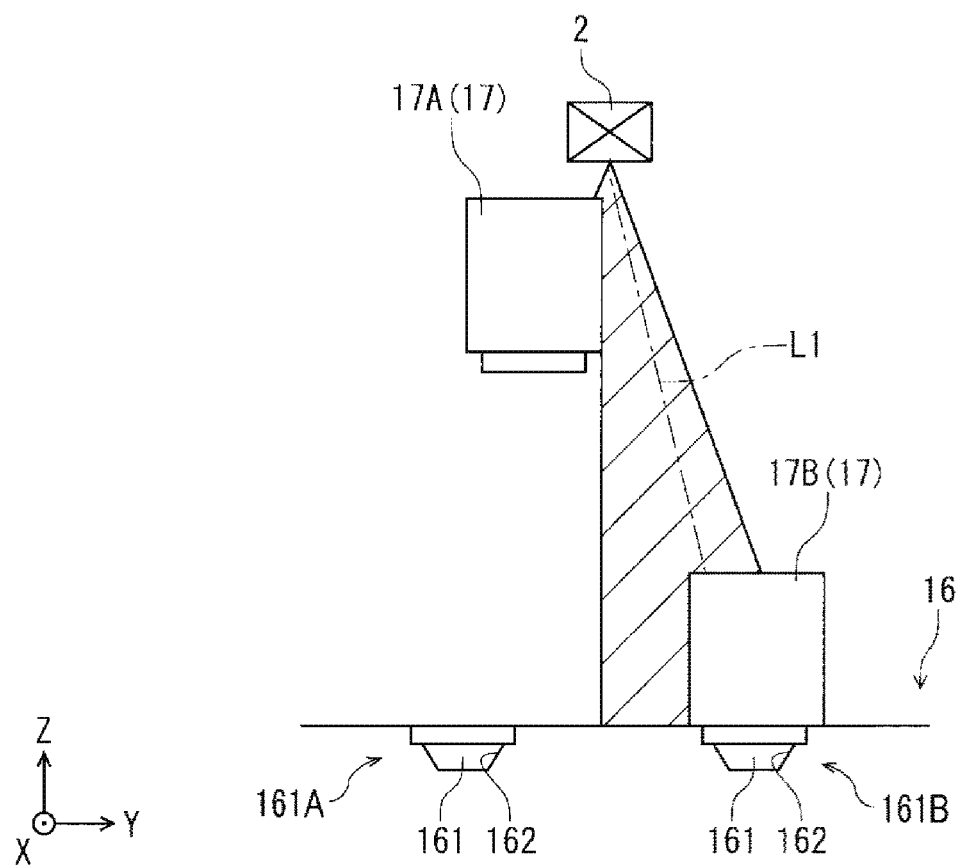
FIG. 17 is a side view of the device transport head of the electronic component tester illustrated in FIG. 1, and is a view for describing the positional relationship between the device transport head and the detection unit.

Further, the device transport head 17 includes the device transport head 17A that serves as the first hand and can move in the Z direction which is the first direction and in the Y direction which is the second direction different from the Z direction, and hold the IC device 90, and the device transport head 17B that serves as the second hand and can move in the Y direction and in the Z direction independently from the device transport head 17A and can hold the IC device 90. In particular, as illustrated in FIGS. 16 and 17, by configuring the device transport head 17A and the device transport head 17B to move independently from each other in the Z direction, both of the device transport head 17A and the device transport head 17B descend, and it is possible to prevent the area where a first camera 31 and a second camera 32 which will be described later can perform the capturing from becoming small.

The device transport head 17A that serves as the first hand and the device transport head 17B that serves as the second hand are disposed side by side in the Y direction which is the second direction, to be separated from each other. Accordingly, for example, a configuration in which the device transport head 17A is responsible for transporting the IC device 90 between the device supply unit 14 or the device collect unit 18 on the −Y side of the test unit 16 and the test unit 16, and the device transport head 17B is responsible for transporting the IC device 90 between the device supply unit 14 or the device collect unit 18 on the +Y side of the test unit 16 and the test unit 16, can be employed. Therefore, it is possible to reduce the moving distance when the entire device transport head 17 is viewed, and the transport efficiency is excellent.

Further, the device transport head 17A that serves as the first hand and the device transport head 17B that serves as the second hand can simultaneously move in the Y direction which is the second direction. Accordingly, for example, when the device transport head 17A is pushing the IC device 90, the device transport head 17B can perform different operations (exchange of the IC device 90 with the device supply unit 14 or the device collect unit 18, and the like), or the reverse thereof can also be performed. Therefore, it is possible to improve the transport efficiency and the test efficiency.

Figure 3:
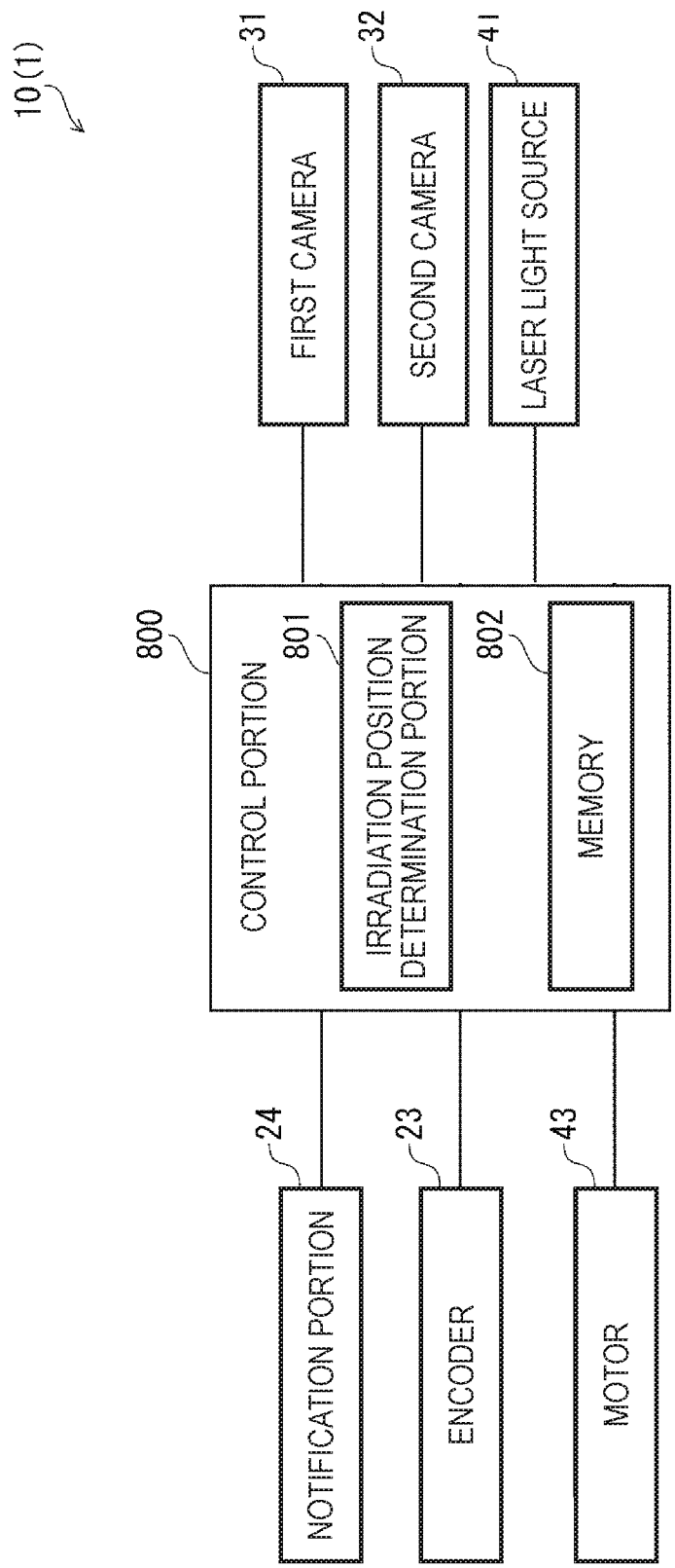
FIG. 3 is a block diagram of the electronic component tester illustrated in FIG. 1.

In addition, as illustrated in FIG. 1, the electronic component handler 10 includes an encoder 23 that serves as a position detection unit which detects the position of the device transport head 17A that serves as the first hand or the device transport head 17B that serves as the second hand. In the embodiment, the encoder 23 detects the positions of each of the device transport head 17A and the device transport head 17B in the Y direction and in the Z direction. Accordingly, as will be described later, for example, the positions of the device transport head 17A and the device transport head 17B can be detected when the first camera 31 and the second camera 32 can capture the test unit 16. As illustrated in FIG. 3, the encoder 23 is electrically connected to the control unit 800, and the position information of the device transport head 17A and the device transport head 17B is transmitted to the control unit 800.

Similar to the temperature adjustment unit 12, the device transport head 17 is configured to be capable of heating and cooling the held IC device 90. Accordingly, the temperature adjustment state in the IC device 90 can be continuously maintained from the device supply unit 14 to the test unit 16.

The test unit 16 is an electronic component placing unit on which the IC device 90 which is the electronic component is placed and tests the electric characteristics of the IC device 90. When viewed from the Z direction, the test unit 16 is in a shape of a rectangular plate that extends in the X direction. Further, the test unit 16 has a plurality (16 in the embodiment) of recess portions 161 for accommodating the IC device 90 therein. Eight of the recess portions 161 are arranged in the X direction, and the eight rows are arranged in a lattice pattern in which two rows are provided in the Y direction.

Figure 11:
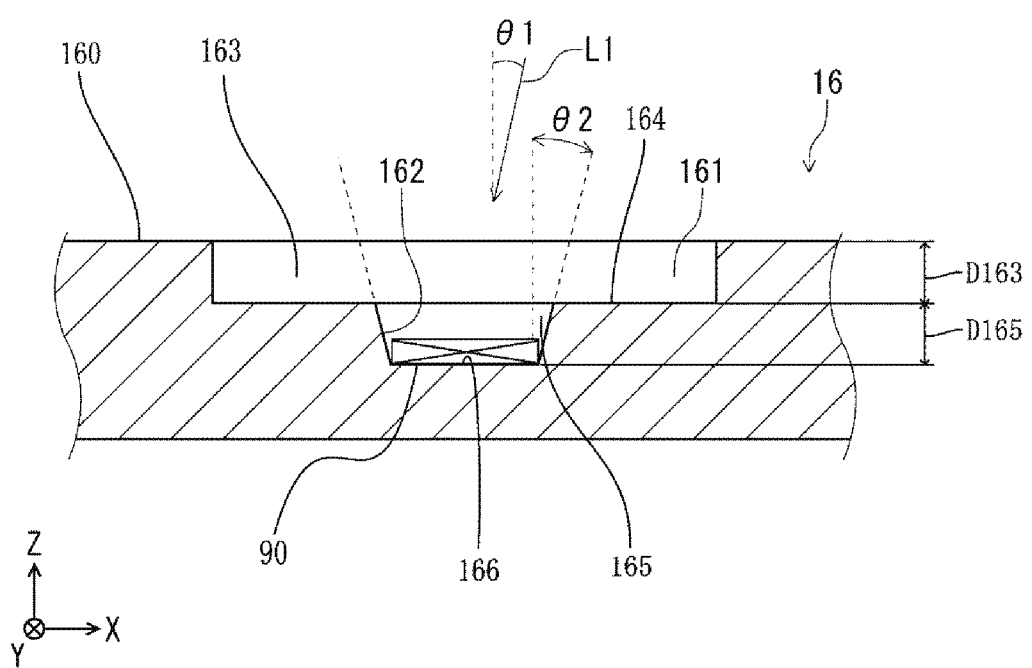
FIG. 11 is an enlarged sectional view of a test unit included in the electronic component tester.

Further, as illustrated in FIG. 11, the recess portion 161 has a stepped structure and includes a first recess portion 163 and a second recess portion 165 provided in a bottom portion 164 of the first recess portion 163. In addition, the second recess portion 165 has a tapered shape for guiding the IC device 90 when the IC device 90 is placed. In other words, an inner circumferential surface 162 of the second recess portion 165 is inclined with respect to the X direction which is the third direction.

Further, a depth D163 (the distance from an upper surface 160 of the test unit 16 to the bottom portion 164) of the first recess portion 163 is preferably 3 mm or more and 7 mm or less, and more preferably 4 mm or more and 6 mm or less. Accordingly, even in a case where the inclination angle of laser light L1 with respect to the X direction is relatively small, the laser light L1 can reach a bottom portion 166 of the second recess portion 165. As a result, it is possible to detect whether or not the IC device 90 remains in the recess portion 161 as will be described later.

Further, a depth D165 (the distance from the bottom portion 164 to the bottom portion 166) of the second recess portion 165 is preferably 3 mm or more and 7 mm or less, and more preferably 4 mm or more and 6 mm or less. Accordingly, even in a case where the inclination angle of laser light L1 with respect to the X direction is relatively small, the laser light L1 can reach the bottom portion 166 of the second recess portion 165. As a result, it is possible to detect whether or not the IC device 90 remains in the recess portion 161 as will be described later.

In addition, an angle $\theta 2$ between the inner circumferential surface 162 of the recess portion 161 and the Z direction is preferably 20° or more and 30° or less, more preferably 23° or more and 27° or less, and particularly preferably 25°. Accordingly, even in a case where the inclination angle of the laser light L1 with respect to the X direction is relatively small, the laser light L1 can reach the bottom portion 166 of the second recess portion 165. As a result, it is possible to detect whether or not the IC device 90 remains in the recess portion 161 as will be described later.

In addition, in the bottom portion 166 of the second recess portion 165, a plurality of probe pins (not illustrated) which are electrically connected to a terminal (not illustrated) of the IC device 90 are provided. In addition, as the terminal of the IC device 90 and the probe pin are electrically connected to each other, that is, come into contact with each other, the IC device 90 can be tested. The test of the IC device 90 is performed based on a program which is stored in a test control unit including a tester connected to the test unit 16. In addition, even in the test unit 16, similar to the temperature adjustment unit 12, the IC device 90 can be heated or cooled, and the temperature of the IC device 90 can be adjusted to the temperature appropriate for the test.

Here, the IC device 90 has a shape of a flat plate in the embodiment and is a rectangle in a plan view. Further, as the size of the IC device 90 in a plan view increases, it becomes easier to detect the presence or absence of the IC device 90. However, in the invention, even when the size of the IC device 90 in a plan view is relatively small, the presence or absence of the IC device 90 can be accurately detected, and the effect of the invention becomes more remarkable as compared with the related art. Regarding a specific minimum value of the IC device 90, although the minimum value also depends on the width of the irradiation shape (line) of the laser light L1 in a case where the shape in a plan view of the IC device 90 is square, the effect of the invention is remarkably obtained when the length of each side is 1 mm or more and 3 mm or less, the effect of the invention is more remarkably obtained when the length is 1.5 mm or more and 2.5 mm or less, and the effect of the invention is particularly remarkably obtained when the length is 2.0 mm. Although the minimum value also depends on the width of the irradiation shape (line) of the laser light L1 in a case where the shape in a plan view of the IC device 90 is rectangle, the effect of the invention is remarkably obtained when the length of a short side is 1 mm or more and 3 mm or less, the effect of the invention is more remarkably obtained when the length is 1.5 mm or more and 2.5 mm or less, and the effect of the invention is particularly remarkably obtained when the length is 2.0 mm. In this manner, by using the relatively small IC device 90, the effect of the invention can be more remarkably obtained. In addition, as described above, it is needless to say that, as the size of the IC device 90 in a plan view increases, it becomes easier to detect the presence or absence of the IC device 90.

Further, the configuration material of the terminal of the IC device 90 is preferably a metal material, such as aluminum, copper, or the like. In addition, the upper surface (the surface opposite to the surface on which the terminals are formed) of the IC device 90 is made of resin or the like, for example, and a surface roughness Ra is preferably 7 μm or more, and more preferably 10 μm or more. Accordingly, the irradiation shape of the laser light L1 becomes clearer, and it is possible to more accurately detect whether or not the IC device 90 remains in the recess portion 161.

The device collect unit 18 has the IC device 90 of which the test is finished by the test unit 16 placed thereon, is configured as the placing unit that can transport the IC device 90 to the collect region A4, and is called "shuttle plate for collection" or simply "collect shuttle".

In addition, the device collect unit 18 is supported to be capable of reciprocating in the X direction between the test region A3 and the collect region A4, that is, along an arrow $\alpha_{18}$ direction. In addition, in the configuration illustrated in FIG. 2, similar to the device supply unit 14, two device collect units 18 are arranged in the Y direction, and the IC device 90 on the test unit 16 is transported and placed to any of the device collect units 18. The transport is performed by the device transport head 17.

The collect region A4 is a region in which the plurality of IC devices 90 which are tested in the test region A3 and of which the test is finished are collected. In the collect region A4, a tray for collection 19, a device transport head 20, and a tray transport mechanism 21 are provided. In addition, in the collect region A4, the empty tray 200 is also prepared.

The tray for collection 19 is a placing unit on which the IC device 90 tested by the test unit 16 is placed, and is fixed not to move in the collect region A4. Accordingly, even in the collect region A4 in which a relatively large number of various types of movable portions, such as the device transport head 20, are disposed, and on the tray for collection 19, the IC device 90 which is already tested is stably placed. In addition, in the configuration illustrated in FIG. 2, three trays for collection 19 are disposed along the X direction.

In addition, three empty trays 200 are disposed along the X direction. The empty tray 200 is also a placing unit on which the IC device 90 tested by the test unit 16 is placed. In addition, the IC device 90 on the device collect unit 18 that has moved to the collect region A4 is transported and placed to any of the tray for collection 19 and the empty tray 200. Accordingly, the IC device 90 is classified for each of the test result, and is collected.

The device transport head 20 is supported to be movable in the X direction and in the Y direction in the collect region A4, and further has a part that can also move in the Z direction. Accordingly, the device transport head 20 can transport the IC device 90 to the tray for collection 19 or the empty tray 200 from the device collect unit 18. In addition, in FIG. 2, the movement of the device transport head 20 in the X direction is illustrated by an arrow $\alpha_{20X}$, and the movement of the device transport head 20 in the Y direction is illustrated by an arrow $\alpha_{20Y}$.

The tray transport mechanism 21 is a mechanism which transports the empty tray 200 transported from the tray remove region A5 in the X direction in the collect region A4, that is, in an arrow $\alpha_{21}$ direction. In addition, after the transport, the empty tray 200 can be disposed at a position at which the IC device 90 is collected, that is, can be any of the three empty trays 200.

The tray remove region A5 is a material remove unit which collects and removes the tray 200 on which the plurality of IC devices 90 in an tested state are arranged. In the tray remove region A5, it is possible to stack multiple trays 200.

In addition, a tray transport mechanism 22A and a tray transport mechanism 22B which transport the trays 200 in the Y direction one by one are provided to go across the collect region A4 and the tray remove region A5. The tray transport mechanism 22A is a moving unit which can allow the tray 200 to reciprocate in the Y direction, that is, in an arrow $\alpha_{22P}$ direction. Accordingly, it is possible to transport the IC device 90 that is already tested from the collect region A4 to the tray remove region A5. In addition, the tray transport mechanism 22B can move the empty tray 200 for collecting the IC device 90 to the positive side in the Y direction, that is, in an arrow $\alpha_{22B}$ direction. Accordingly, it is possible to move the empty tray 200 from the tray remove region A5 to the collect region A4.

The control unit 800 (processor) can control, for example, operations of each portion of the tray transport mechanism 11A, the tray transport mechanism 11B, the temperature adjustment unit 12, the device transport head 13, the device supply unit 14, the tray transport mechanism 15, the test unit 16, the device transport head 17, the device collect unit 18, the device transport head 20, the tray transport mechanism 21, the tray transport mechanism 22A, and the tray transport mechanism 22B. In addition, the control unit 800 includes at least one processor, such as a central processing unit (CPU) externally attached to a personal computer (PC) or a micro processing unit (MPU), or a field programmable gate array (FPGA), the processor reads various instructions, determinations, or commands which are stored in the control unit 800, and the processor performs various instructions, various determinations, various commands and the like. In addition, the control unit 800 may be the central processing unit (CPU), the micro processing unit (MPU), or the field programmable gate array (FPGA) which are embedded in the capturing unit.

Further, as illustrated in FIG. 3, the control unit 800 has a memory 802 (storage unit). The memory 802 has, for example, an electrically erasable programmable read-only memory (EEPROM) which is a type of nonvolatile semiconductor memory, and stores various programs for the above-described test and the like.

The operator can set or confirm an operation condition or the like of the electronic component tester 1 via the monitor 300. The monitor 300 includes a display screen 301 configured of, for example, a liquid crystal screen, and is disposed in an upper portion on the front side of the electronic component tester 1. As illustrated in FIG. 1, on a right side in the drawing of the tray remove region A5, a mouse table 600 on which a mouse is placed is provided. The mouse is used when operating the screen displayed on the monitor 300.

In addition, at a lower right part of FIG. 1 with respect to the monitor 300, the operation panel 700 is disposed. In addition to the monitor 300, the operation panel 700 is a panel for commanding a desirable operation to the electronic component tester 1.

In addition, by combining generated colors, the signal lamp 400 can notify the operator of an operation state or the like of the electronic component tester 1. The signal lamp 400 is disposed in an upper portion of the electronic component tester 1. In addition, in the electronic component tester 1, a speaker 500 is embedded, and it is also possible to notify the operator of the operation state or the like of the electronic component tester 1 by the speaker 500.

The monitor 300, the signal lamp 400, and the speaker 500 function as a notification unit 24 which notifies the result of determination as to whether or not the IC device 90 is disposed in the recess portion 161 of the test unit 16 as will be described later. Accordingly, it is possible to notify the operator of the electronic component handler 10 of the result of the determination.

In the electronic component tester 1, the tray supply region A1 and the supply region A2 are partitioned by a first partition wall 231, the supply region A2 and the test region A3 are partitioned by a second partition wall 232, the test region A3 and the collect region A4 are partitioned by a third partition wall 233, and the collect region A4 and the tray remove region A5 are partitioned by a fourth partition wall 234. In addition, the supply region A2 and the collect region A4 are partitioned by a fifth partition wall 235.

The most exterior of the electronic component tester 1 is covered with a cover, and examples of the cover include a front cover 241, a side cover 242, a side cover 243, a rear cover 244, and a top cover 245.

Figure 4:
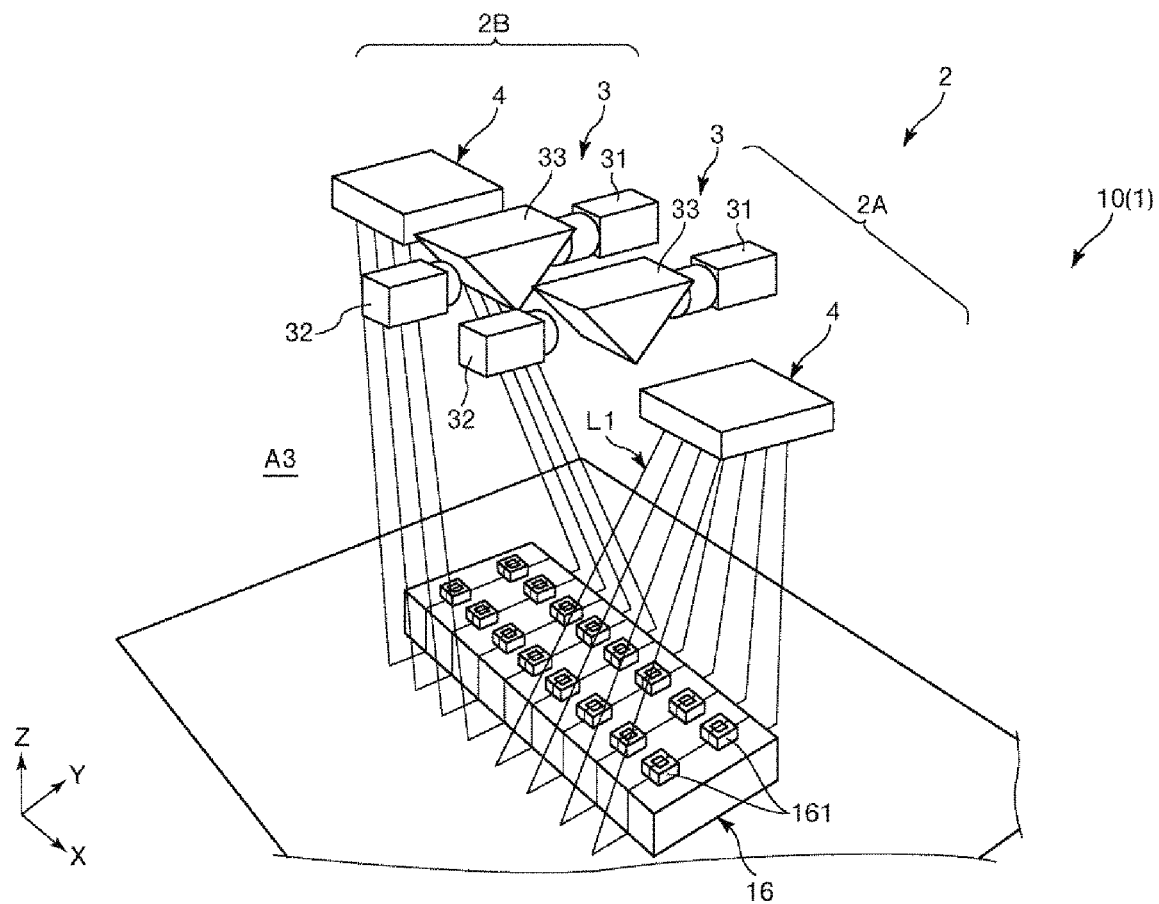
FIG. 4 is a perspective view illustrating a test region of the electronic component tester illustrated in FIG. 1.
Figure 5:
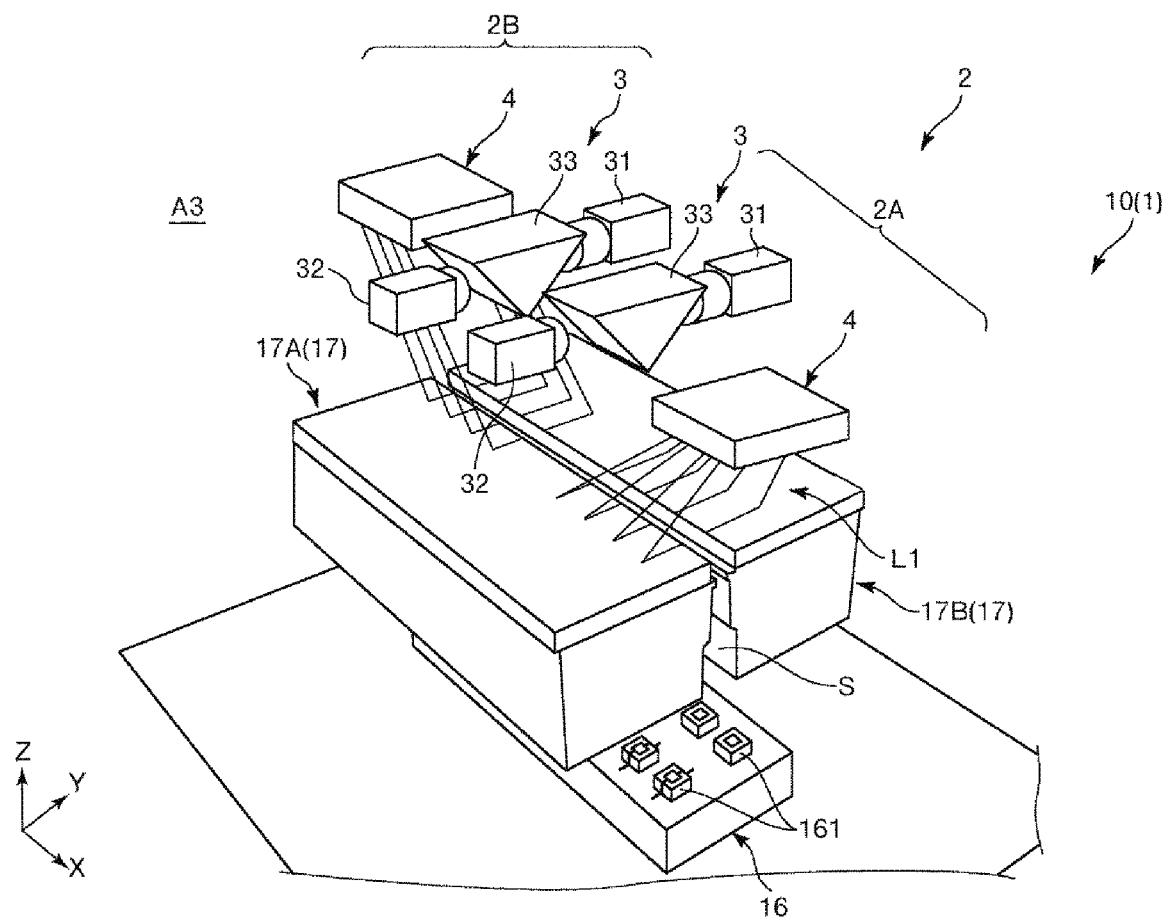
FIG. 5 is a perspective view illustrating the test region of the electronic component tester illustrated in FIG. 1, and is a view in which a device transport head is not illustrated.

Next, a detection unit 2 will be described. As illustrated in FIGS. 4 and 5, the detection unit 2 includes a detection unit 2A and a detection unit 2B. The detection unit 2A and the detection unit 2B are provided on the +Z side of the device transport head 17 (refer to FIG. 5) and are disposed side by side in this order from the +X direction.

The detection unit 2A and the detection unit 2B respectively include the capturing unit 3 and the light irradiation unit 4. Since the detection unit 2A and the detection unit 2B have the same configuration except that the disposition positions of the capturing unit 3 and the light irradiation unit 4 are axisymmetric with respect to the Y axis, hereinafter, the detection unit 2A will be representatively described.

Figure 6:
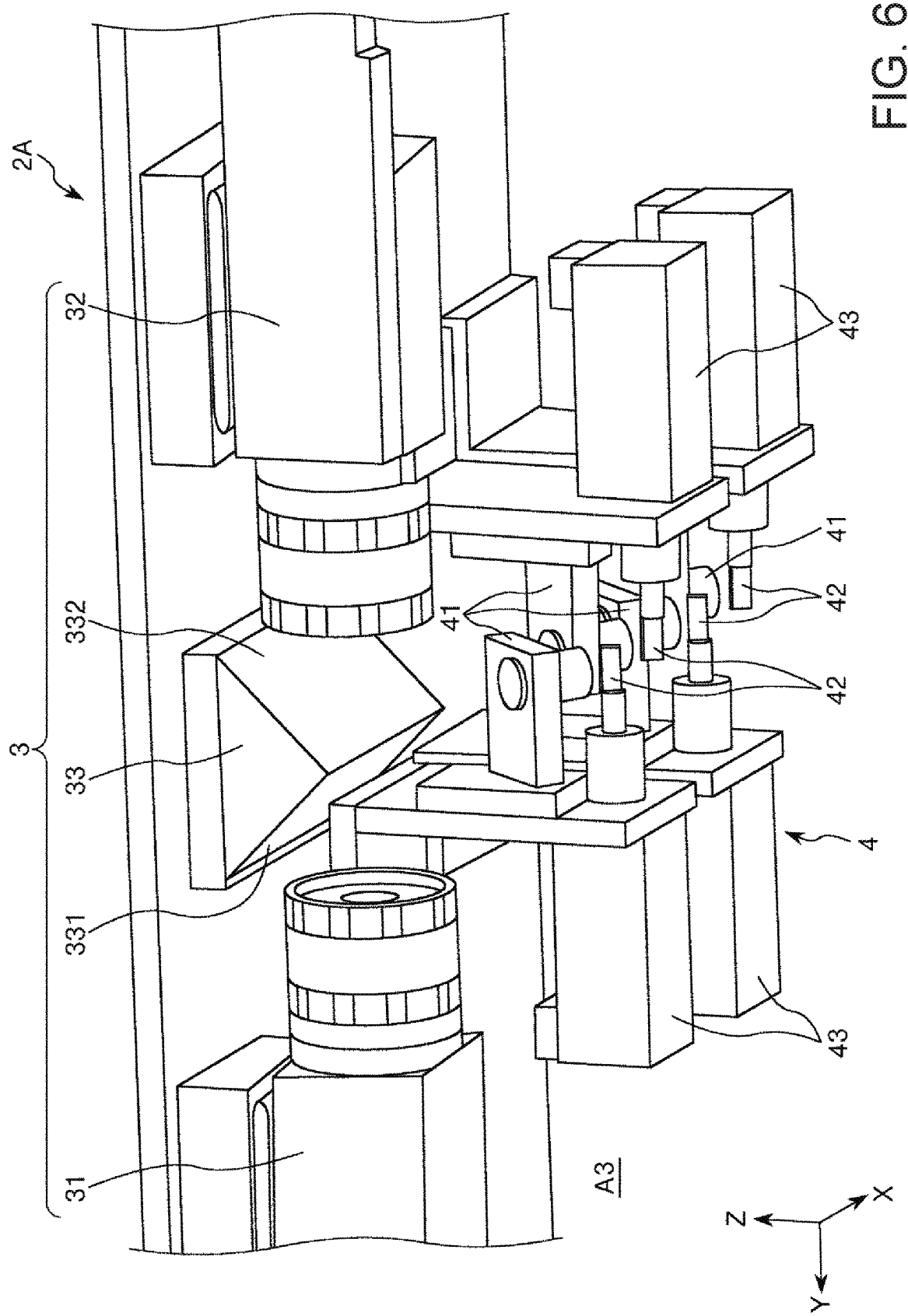
FIG. 6 is a perspective view of a detection unit included in the electronic component tester illustrated in FIG. 1.
Figure 7:
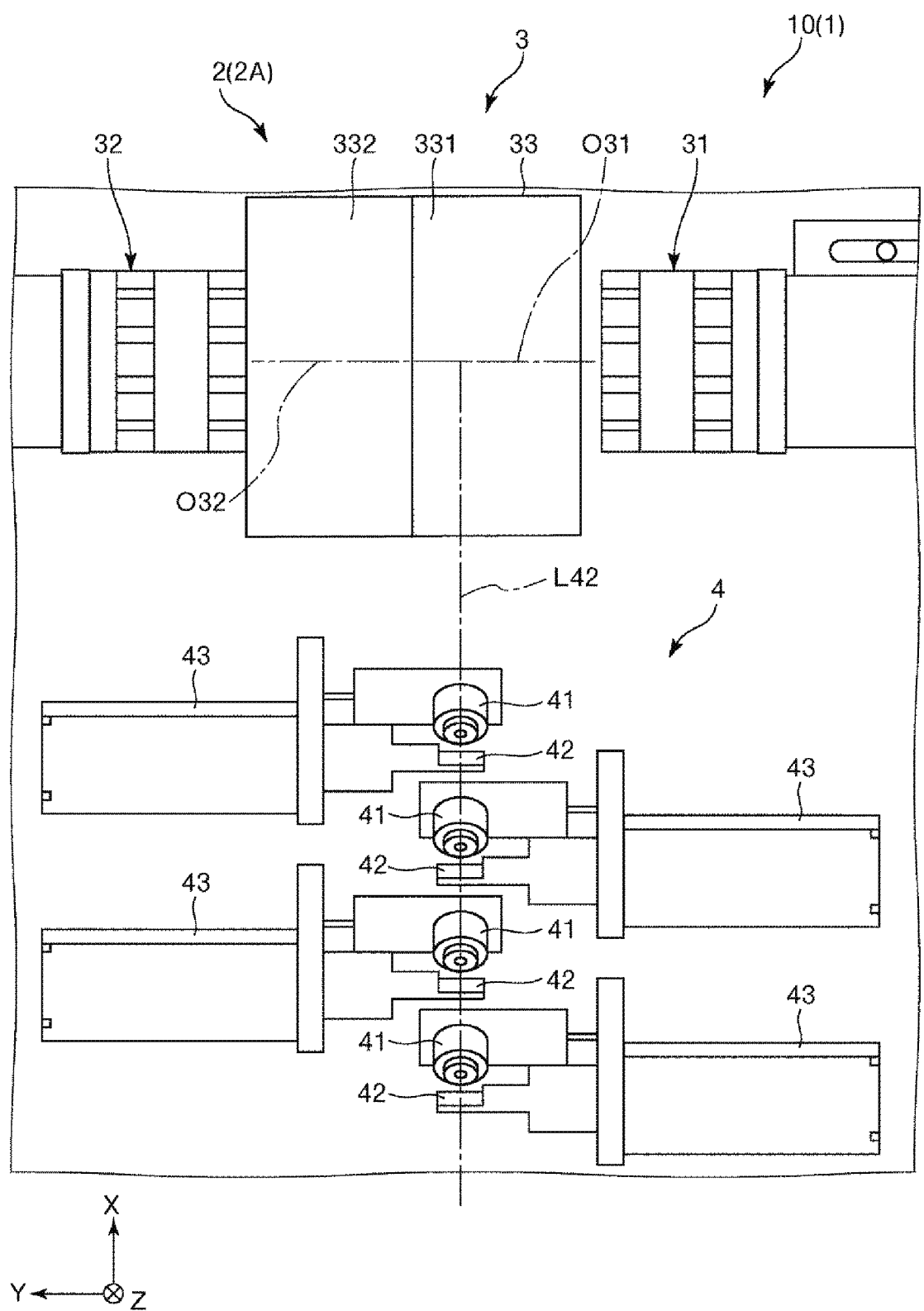
FIG. 7 is a view of the detection unit included in the electronic component tester illustrated in FIG. 1 viewed from below.

As illustrated in FIGS. 6 and 7, the capturing unit 3 includes the first camera 31 (first capturing unit), the second camera 32 (second capturing unit), and a light reflection unit 33.

For example, a charge coupled device (CCD) camera can be used as the first camera 31. In addition, the first camera 31 is disposed facing the −Y direction, and captures the −Y side. As illustrated in FIG. 3, the first camera 31 is electrically connected to the control unit 800, and the operation thereof is controlled.

The second camera 32 may have a configuration similar to that of the first camera 31. In addition, the second camera 32 is disposed facing the +Y direction, and captures the +Y side. As illustrated in FIG. 3, the second camera 32 is electrically connected to the control unit 800, and the operation thereof is controlled.

The light reflection unit 33 is provided between the first camera 31 and the second camera 32. The light reflection unit 33 reflects the image of the test unit 16 toward the first camera 31 and the second camera 32.

The light reflection unit 33 includes a first light reflection surface 331 (first light reflection unit) for reflecting the light and a second light reflection surface 332 (second light reflection unit) for reflecting the light. The light reflection unit 33 is a triangular prism member of an isosceles triangle (right isosceles right triangle in the embodiment) when viewed from the X direction, and is disposed such that an apex angle is positioned on the −Z side.

In addition, in the light reflection unit 33, the surface on the +Y side functions as the first light reflection surface 331, and the surface on the −Y side functions as the second light surface 332.

The first light reflection surface 331 is provided between the first camera 31 (first image capturing unit) and the second camera 32 (second image capturing unit), and reflects the image of the test unit 16 (electronic component placing unit) toward the first camera 31. On the first light reflection surface 331, the first camera 31 can capture the image of the test unit 16 from the space between the device transport head 17A (first hand) and the device transport head 17B (second hand). The second light reflection surface 332 is provided between the second camera (second capturing unit) and the first light reflection surface 331, and reflects the image of the test unit 16 (electronic component placing unit) toward the second camera 32. On the second light reflection surface 332, the second camera 32 can capture the image of the test unit 16 from the space between the device transport head 17A (first hand) and the device transport head 17B (second hand).

Accordingly, even when a gap S between the device transport head 17A and the device transport head 17B is relatively narrow, the first camera 31 and the second camera 32 can capture the test unit 16, respectively. In addition, the capturing direction of the first camera 31 and the second camera 32 in the specification is the Z direction.

Further, an optical axis up to the first light reflection surface 331 (first light reflection unit) of the first camera 31 (first capturing unit) and an optical axis of the second camera 32 (second capturing unit) are arranged in the Y direction (second direction). In other words, the optical axis up to the first light reflection surface 331 (first light reflection unit) of the first camera 31 (first capturing unit) and the optical axis of the second camera 32 (second capturing unit) are arranged in parallel to each other. Accordingly, the first camera 31, the second camera 32, and the light reflection unit 33 can be easily installed.

The first camera 31 (first capturing unit) and the second camera 32 (second capturing unit) are opposite to each other in the direction in which the light is incident. In other words, the first camera 31 and the second camera 32 are disposed to face each other and captures the opposite direction. Accordingly, even when the gap S between the device transport head 17A and the device transport head 17B is relatively narrow, by providing the light reflection unit 33 between the first camera 31 and the second camera 32, the first camera 31 and the second camera 32 can capture the test unit 16, respectively.

With such a configuration, the first camera 31 (the first capturing unit) and the second camera 32 (the second capturing unit) can capture the regions of which the positions are different from each other in the test unit 16 (electronic component placing unit). Accordingly, it is possible to capture more regions of the test unit 16.

Further, as illustrated in FIG. 7, the first camera 31 which is the first capturing unit, is disposed such that an optical axis O32 thereof intersects with an extension line L42 in a direction (X direction) in which mirrors 42 which are light reflection units that will be described later. Accordingly, the first camera 31 can capture the part of the test unit 16 irradiated with the laser light L1 reflected by each of the mirrors 42.

The light irradiation unit 4 includes four laser light sources (light irradiation units) 41, four mirrors 42 which is provided corresponding to each of the laser light sources 41 and reflects the laser light L1 emitted from the laser light source 41, and four motors 43 for rotating each of the mirrors 42. In other words, in the light irradiation unit 4, a plurality (four) of laser light sources 41 which are light irradiation units and mirrors 42 which are light reflection units, are provided.

As the laser light source 41, a known laser light source can be used, and the color of the emitted laser light L1 is not particularly limited. In addition, the laser light source 41 that serves as the light irradiation unit emits the laser light L1 (light) of which the irradiation shape at the irradiation destination (the test unit 16 or the IC device 90 on the test unit 16) is linear that extends in the Y direction (second direction). Accordingly, as will be described later, it is possible to make it easy to understand the change in position of the irradiated laser light L1 depending on the presence or absence of the IC device 90 in the image captured by the first camera 31 and the second camera 32. Accordingly, it is possible to more accurately detect whether or not the IC device 90 remains in the test unit 16.

Further, as illustrated in FIGS. 4 and 5, the laser light L1 emitted by the laser light source 41 is configured so as to include two recess portions 161 arranged in the Y direction in the test unit 16 at the irradiation destination. In other words, one laser light source 41 collectively emits the laser light L1 to two recess portions 161 arranged in the Y direction. Four (plural) laser light sources 41 (light irradiation units) are provided and arranged side by side along the X direction which is the third direction, and accordingly, it is possible to irradiate 8 recess portions 161 with the laser light L1 by four laser light sources 41. In addition, as the total of eight laser light sources 41 are provided in the detection unit 2A and the detection unit 2B, each of the 16 recess portions 161 can be irradiated with the laser light L1.

Figure 8:
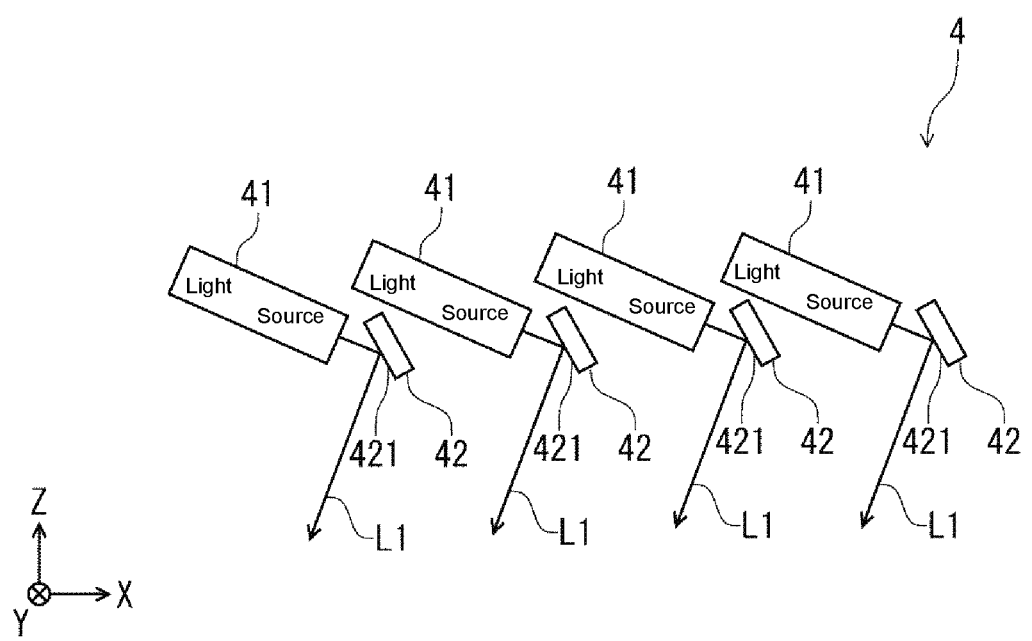
FIG. 8 is a side view of a light irradiation unit included in the electronic component tester illustrated in FIG. 1.

Further, as illustrated in FIG. 8, when viewed from the Y direction, each of the laser light sources 41 is disposed to be inclined with respect to the X direction. Therefore, it is possible to prevent the laser light source from interfering with the adjacent mirror 42. As a result, the distance in the X direction between the laser light source 41 and the mirror 42 can be made as small as possible, which contributes to reducing the size of the light irradiation unit 4. In particular, in the electronic component handler 10, the space on the +Z side of the device transport head 17 is limited, and the reduction of the size of the light irradiation unit 4 contributes to the reduction of the size of the entire electronic component handler 10.

Such a laser light source 41 is electrically connected to the control unit 800, and the operation thereof is controlled (refer to FIG. 3).

As illustrated in FIGS. 6 and 7, the light irradiation unit 4 has the mirror 42 that serves as the light reflection unit for reflecting the laser light L1 emitted from the laser light source 41 which is the light irradiation unit. Accordingly, the laser light source 41 can be disposed regardless of the direction of the laser light source 41. Accordingly, it is possible to increase the degree of freedom of disposition of the laser light source 41.

As illustrated in FIG. 8, the mirror 42 has a reflection surface 421 that reflects the laser light L1, and is disposed such that the reflection surface 421 faces the laser light source 41.

In addition, each of the mirrors 42 is disposed side by side in the X direction (third direction) that intersects with the Z direction (first direction) and the Y direction (second direction). Accordingly, it is possible to match with the disposition form of each of the laser light sources 41, and to simplify the disposition form of each of the mirrors 42.

Further, the light irradiation unit 4 has four motors 43 that serve as a light reflection unit driving unit for rotating the mirror 42 that serves as a light reflection unit. Since the mirror 42 is configured to be rotatable, the orientation of the reflection surface 421 of the mirror can be adjusted, and the irradiation position of the laser light L1 can be adjusted.

Figure 9:
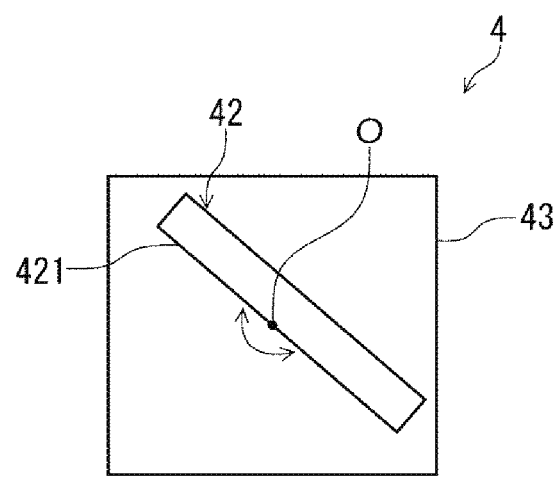
FIG. 9 is a view for describing a position of a rotation axis of a mirror included in the light irradiation unit illustrated in FIG. 8.

Further, as illustrated in FIG. 9, the mirror 42 is connected to the motor 43 such that a rotation axis O thereof is positioned on the light reflection surface. Accordingly, when the irradiation direction of the laser light L1 is adjusted by rotating the mirror 42, the adjustment can be performed accurately.

In this manner, in the electronic component handler 10, since the direction of the laser light L1 emitted by the laser light source 41 that serves as the light irradiation unit can be adjusted, it is possible to adjust the irradiation position of the laser light L1 in the test unit 16, and to deal with the test unit of which the disposition location of the recess portion 161 is different from the configuration illustrated in FIGS. 4 and 5.

In addition, by adjusting the laser light source 41 which is the light irradiation unit so as to emit the laser light L1 in at least a direction inclined with respect to the Z direction which is the first direction, that is, in a direction which intersect and is not orthogonal to the Z direction, as will be described later, changes in position of the irradiated laser light L1 can be easily understood in accordance with the presence or absence of the IC device 90.

In addition, each of the motors 43 that serve as the light reflection unit driving unit is disposed side by side along the X direction which is the third direction. In addition, the motors 43 adjacent to each other in the X direction are arranged so as to be shifted in the Y direction which is the second direction, and are arranged in a so-called staggered disposition. Accordingly, it is possible to prevent the motors 43 adjacent to each other in the X direction from interfering with each other even when the interval between the motors 43 in the X direction is made relatively small. As a result, it is possible to reduce the size of the light irradiation unit 4.

According to the detection unit 2, it is possible to detect the presence or absence of the IC device 90 in the recess portion 161 of the test unit 16. Hereinafter, the principle will be described with reference to FIGS. 10 to 13, but in order to perform similar detection in each of the recess portions 161, detection in one recess portion 161 will be representatively described. In addition, in the following description, one of the images of the recess portion 161 captured by the first camera 31 will be representatively described, but similar control can also be performed with respect to the image of the recess portion 161 captured by the second camera 32.

Figure 10:
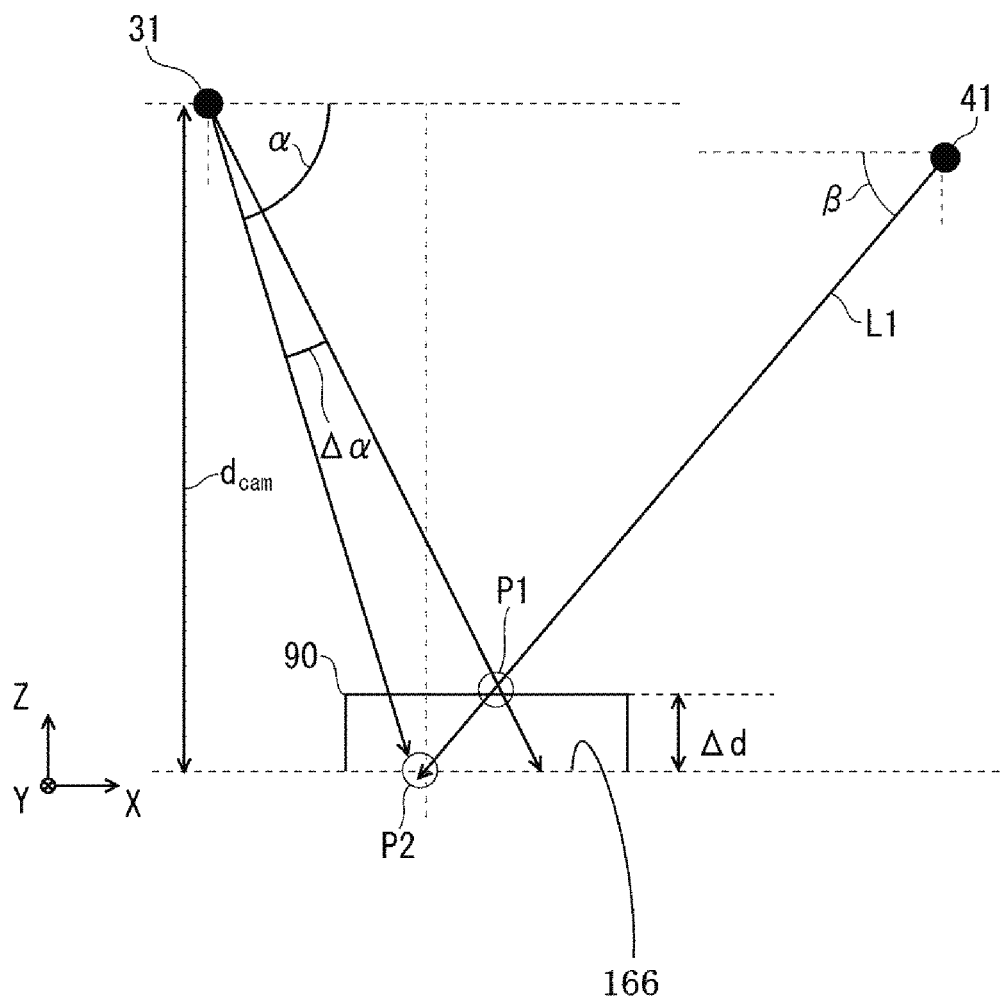
FIG. 10 is a schematic view for describing a detection principle of the detection unit included in the electronic component tester illustrated in FIG. 1.

FIG. 10 is a view schematically illustrating the detection unit 2, and is a view of the detection unit 2 viewed from the Y direction. Further, in FIG. 10, the laser light L1 is emitted from the laser light source 41 toward the test unit 16. In a case where the IC device 90 is placed on the test unit 16 (hereinafter, the state is referred to as "remaining state"), the laser light L1 is emitted to the position P1 on the IC device 90, and at the position P1, a line of the laser light L1 having a linear irradiation shape is formed. Meanwhile, in a case where the IC device 90 does not exist on the test unit 16 (hereinafter, the state is referred to as "removed state"), the laser light L1 is emitted to the position P2 of the bottom portion 166 of the second recess portion 165 of the test unit 16, and at the position P2, a line of the laser light L1 having a linear irradiation shape is formed. In addition, in the specification, the term "linear" means a single straight line, an aggregate of points separated from each other in one direction, or elongated shapes, such as an ellipse or a rectangle.

Figure 12:
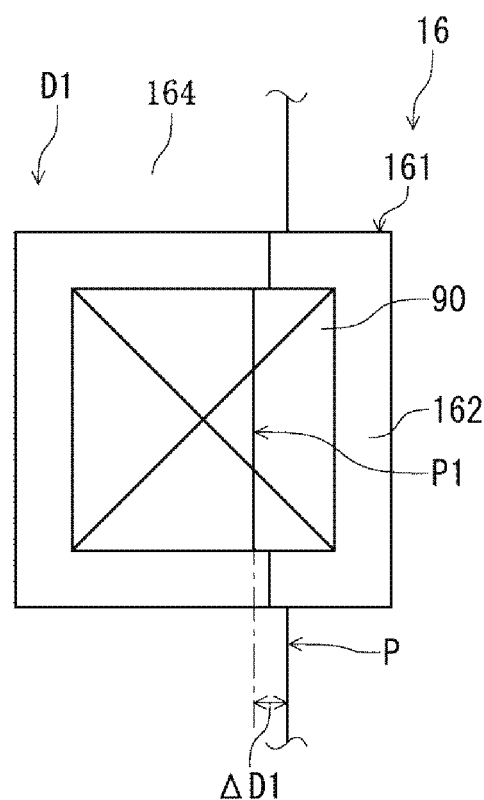
FIG. 12 is a view illustrating a part of an image (first image) of a recess portion of the test unit included in the electronic component tester illustrated in FIG. 1, and is a view illustrating a remaining state.
Figure 13:
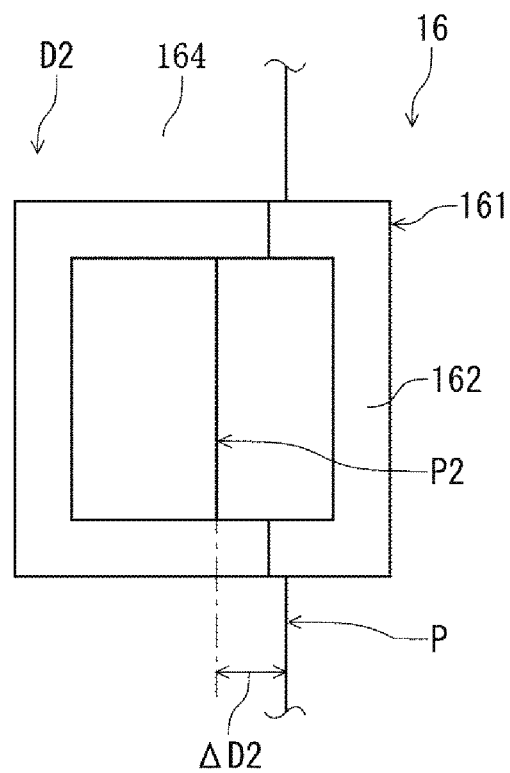
FIG. 13 is a view illustrating a part of an image (first image) of a recess portion of the test unit included in the electronic component tester illustrated in FIG. 1, and is a view illustrating a removed state.

In addition, the first camera 31 captures the images in the remaining state and the removed state, respectively. FIG. 12 illustrates a part of an image D1 captured by the first camera 31 in the remaining state, and FIG. 13 illustrates a part of an image D2 captured by the first camera 31 in the removed state. In the images D1 and D2, necessary parts (parts at which the recess portions 161 are taken) of the captured images are trimmed and used.

As illustrated in FIG. 12, in the image D1, the position P1 of the line of the laser light L1 on the IC device 90 is shifted to the −X side (leftward-and-rightward direction) from the position P of the line of the laser light L1 in the bottom portion 164 of the first recess portion 163. This is because the top surface of the IC device 90 is positioned to be lower than the bottom portion 164 of the first recess portion 163, that is, on the −Z side. In addition, a shift amount in the X direction (the leftward-and-rightward direction in the drawing) between the position P and the position P1 is set as a shift amount ΔD1.

Meanwhile, as illustrated in FIG. 13, in the image D2, the position P2 of the line of the laser light L1 in the bottom portion 166 of the second recess portion 165 is shifted to the −X side from the position P of the line of the laser light L1 in the bottom portion 164 of the first recess portion 163. This is because the bottom portion 166 of the second recess portion 165 is positioned to be lower than the bottom portion 164 of the first recess portion 163, that is, on the −Z side. In addition, a shift amount in the X direction (the leftward-and-rightward direction in the drawing) between the position P and the position P2 is set as a shift amount ΔD2.

Further, the shift amount ΔD1 is smaller than the shift amount ΔD2. This is because the upper surface of the IC device 90 is positioned on the +Z side from the bottom portion 166 of the second recess portion 165. In the electronic component handler 10, for example, it is possible to detect (determine) whether the remaining state or the removed state depending on whether the shift amount in the image D1 and image D2 is the shift amount ΔD1 or the shift amount ΔD2.

Here, as a thickness Δd of the IC device 90 becomes thinner, a difference between the shift amount ΔD1 and the shift amount ΔD2 becomes smaller, and it is difficult to determine whether the shift amount is the shift amount ΔD1 or the shift amount ΔD2. Therefore, in the comparatively thin IC device 90, it is necessary to use the first camera 31 having a relatively high resolution in order to determine whether the state is the remaining state or the removed state. Specifically, in FIG. 10, when using the first camera 31 having resolving power that makes it possible to recognize an angle Δα between a line segment which links the position P1 and the center (optical axis) of the first camera 31 to each other and a line segment which links the position P2 and the center (optical axis) of the first camera 31 to each other, it is possible to determine whether the state is the remaining state or the removed state. For example, when the thickness Δd of the IC device 90 is known, in order to know a camera which can recognize any extent of the angle Δα to be used, or when the resolving power of the first camera 31 is known, in order to know what extent of the thickness Δd of the IC device 90 can make the above determination, the inventors have derived the following two equations (1) and (2).

An angle between the line segment which links the position P2 and the center (optical axis) of the first camera 31 to each other and the X axis is α, an angle between the optical axis of the laser light L1 and the X axis is β, and a separation distance between the optical axis and the bottom portion 166 of the second recess portion 165 in the first camera 31 is $d_{ram}$, the thickness Δd of the IC device 90 can be expressed by the equation (1) and the angle Δα can be expressed by the equation (2).

$$\Delta d = \frac{\tan(\beta)\|\tan(\alpha) - \tan(\alpha - \Delta\alpha)\|}{\tan(\alpha)[\tan(\alpha - \Delta\alpha) + \tan(\beta)\|]} d_{cam} \quad (1)$$

$$\Delta\alpha = \alpha - \tan^{-1}\left[\frac{\tan(\alpha)\cdot\tan(\beta)\cdot(d_{cam} + \Delta d)}{d_{cam}\tan(\beta) - \Delta d\tan(\alpha)}\right] \quad (2)$$

For example, when the angle Δα is known, by substituting the angle Δα into the equation (1), it is possible to know the minimum thickness Δd of the IC device 90 that can be determined. Further, when the thickness Δd is known, by substituting the thickness Δd to the equation (2), it is possible to know the resolution power necessary for the first camera 31.

In addition, it is preferable that the determination can be performed with respect to the IC device 90 having the thickness Δd of 0.2 mm or more, and it is more preferable that it is possible to perform the determination with respect to the electronic component of 0.1 mm or more. Accordingly, even with the relatively thin IC device 90, it is possible to detect whether or not the IC device 90 remains in the test unit 16. In addition, when the thickness Δd is extremely small, it is necessary to use the first camera 31 having relatively high resolving power, which is costly.

In addition, as the angle β between the optical axis of the laser light L1 and the X axis decreases, the shift amount ΔD1 and the shift amount ΔD2 increase, and in the image, it is possible to make it easy to determine whether the shift amount is the shift amount ΔD1 or the shift amount ΔD2. When the angle β is extremely small, there is a case where the laser light L1 is unlikely to be incident on the recess portion 161.

Therefore, as illustrated in FIG. 11, it is preferable that the incident angle θ1 of the laser light L1 emitted from the laser light source 41 which is the light irradiation unit is smaller than the angle θ2 between the inner circumferential surface 162 of the recess portion 161 and the Z direction. Accordingly, the laser light L1 can be emitted into the recess portion 161. As a result, it is possible to detect whether or not the IC device 90 remains in the recess portion 161.

In the electronic component handler 10, it is difficult to ensure a space for installing the detection unit 2. For example, even when the detection unit 2 is disposed in the vicinity of the test unit 16, that is, at a position shifted from the test unit 16 when viewed from the Z direction, the range in which the irradiation of the laser light L1 is limited or an area in which the first camera 31 and the second camera 32 can perform the capturing is limited. Considering the facts, it is preferable to perform the capturing by disposing the area immediately above the test unit 16, that is, on the +Z side of the test unit 16, but the device transport head 17 is provided on the +Z side of the test unit 16.

Here, in the electronic component handler 10, a configuration in which the detection unit 2 is disposed on the +Z side of the device transport head 17 and the detection is performed via the gap S between the two device transport heads 17A and 17B, is employed. In other words, a configuration in which the laser light L1 is emitted toward the test unit 16 via the gap S, and the determination is performed by capturing the image by using the first camera and the second camera 32 via the gap S, is employed. Accordingly, even with the above-described configuration, it is possible to accurately detect (determine) whether the state is the remaining state or the removed state.

Here, since the gap S is comparatively narrow and the device transport head 17 moves in the Y direction and in the Z direction, there is a case where it is difficult to capture the entire area of the test unit 16, particularly, the entire region of the test unit 16 in the Y direction by the first camera 31 and the second camera 32.

Figure 14:
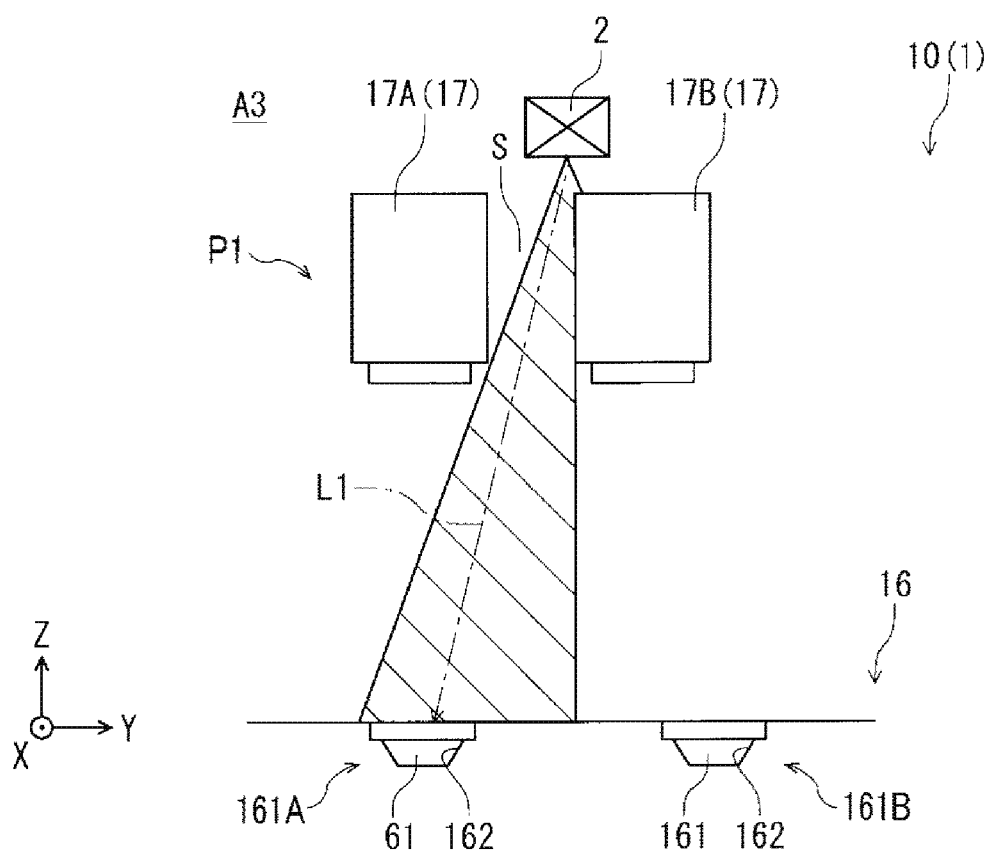
FIG. 14 is a side view of the device transport head of the electronic component tester illustrated in FIG. 1, and is a view for describing a positional relationship between the device transport head and the detection unit.

For example, when the device transport head 17 is positioned at the position P1 (first position) illustrated in FIG. 14, 8 recess portions 161 on the −Y side among 16 recess portions 161 can be captured, but it is difficult to capture the eight recess portions 161 on the +Y side.

Figure 15:
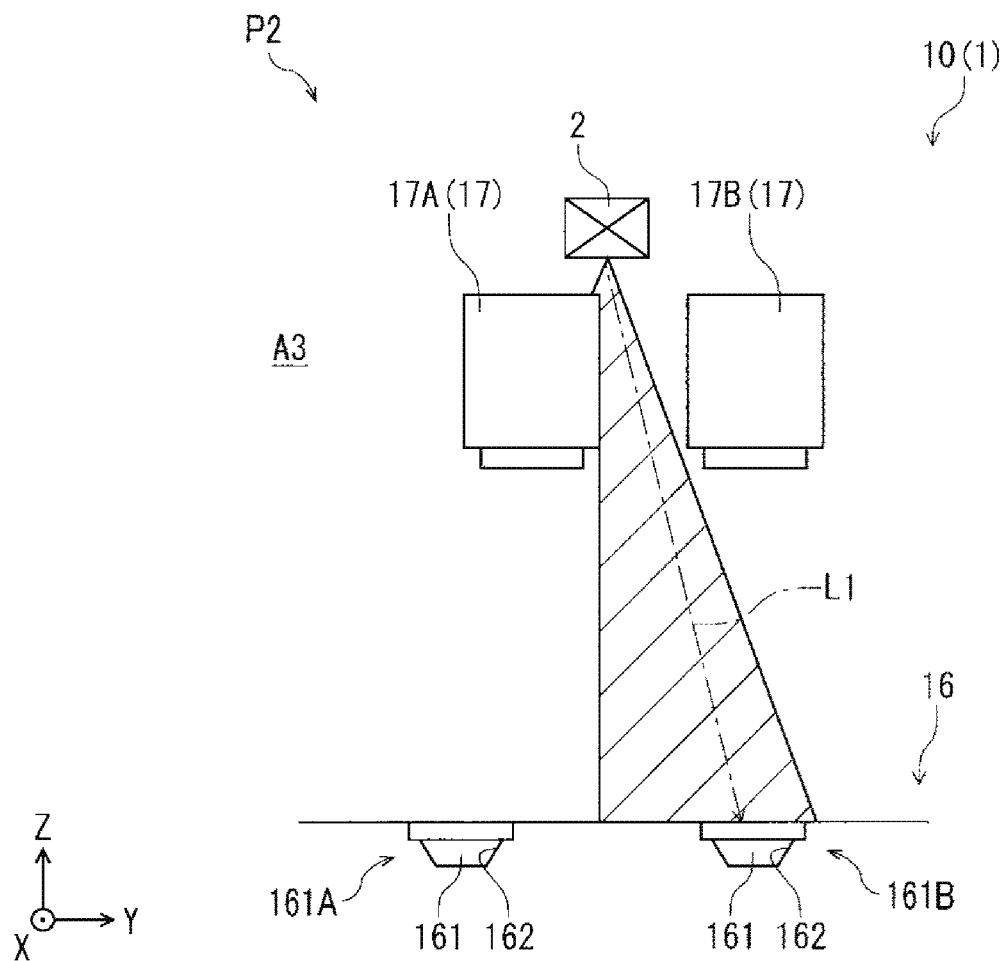
FIG. 15 is a side view of the device transport head of the electronic component tester illustrated in FIG. 1, and is a view for describing the positional relationship between the device transport head and the detection unit.

In addition, when the device transport head 17 is positioned at the position P2 (second position) illustrated in FIG. 15, 8 recess portions 161 on the +Y side among 16 recess portions 161 can be captured, but it is difficult to capture the eight recess portions 161 on the −Y side.

In addition, in the configuration illustrated in FIG. 18, each of the recess portions 161 of the test unit 16 can be divided into a row 161A and a row 161B of eight recess portions 161 arranged along the X direction. The row 161A and the row 161B are arranged in this order from the −Y direction. In addition, since the gap S is relatively narrow, it is difficult to capture the entire area of the test unit 16, that is, the row 161A and the row 161B by the first camera 31 and the second camera 32 as one image.

Here, as illustrated in FIG. 14, during the movement of the device transport head 17, among 16 recess portions 161, the capturing is performed when the row 161B can be captured, that is, when the device transport head 17 is positioned at the first position P1, and the image d1 (first image) is obtained. In addition, as illustrated in FIG. 15, the capturing is performed when it is possible to capture the row 161A, that is, when the device transport head 17 is positioned at the second position P2, the image d2 (second image) is obtained.

The capturing unit 3 of the detection unit 2A is responsible for capturing the four recess portions 161 on the +X side of the row 161A and the four recess portions 161 on the +X side of the row 161B.

In the electronic component handler 10, it is possible to perform the above-described determination based on the images d1 and d2. Accordingly, even when it is difficult to capture the entire region of the test unit 16 in the Y direction, it is possible to capture each of the recess portions 161 based on the plurality of images, and to detect (determine) whether the state is the remaining state or the removed state in the entire recess portion 161.

In addition, the position of the device transport head 17 in the state where the capturing is possible is detected by the encoder 23, and an encoder value when the capturing is possible is stored in the memory 802.

Further, in the electronic component handler 10, when the device transport head 17A (first hand) is pushing the IC device 90 against the test unit 16 (electronic component placing unit), there is a case where the device transport head 17A is positioned between the first camera 31 (capturing unit) and the IC device 90 (refer to FIG. 16). In this case, the device transport head 17A shields and it becomes difficult to capture 8 recess portions 161 on the −Y side. Meanwhile, when the device transport head 17B (second hand) is pushing the IC device 90 against the test unit 16 (electronic component placing unit), there is a case where the device transport head 17B is positioned between the first camera 31 (capturing unit) and the IC device 90 (refer to FIG. 17). In this case, the device transport head 17B shields and it becomes difficult to capture 8 recess portions 161 on the +Y side. Utilizing this problem, for example, in a case where the first camera 31 is configured to capture the images only when the IC device 90 can capture an image, timing at which the capturing is difficult is known, and thus, it is possible to easily perform setting about at which timing the capturing is omitted. As a result, it is possible to prevent capturing of unnecessary images.

In addition, during a period from a capturing start time to the capturing completion time, the first camera 31 and the second camera 32 can capture the test unit 16 (electronic component placing unit) via the space between the device transport head 17A (first hand) and the device transport head 17B (second hand). In other words, the capturing is omitted when the test unit 16 is shielded by the device transport head 17A or the device transport head 17B. Accordingly, it is possible to perform the capturing without waste, and it is possible to prevent wasteful increase in image data.

Figure 19:
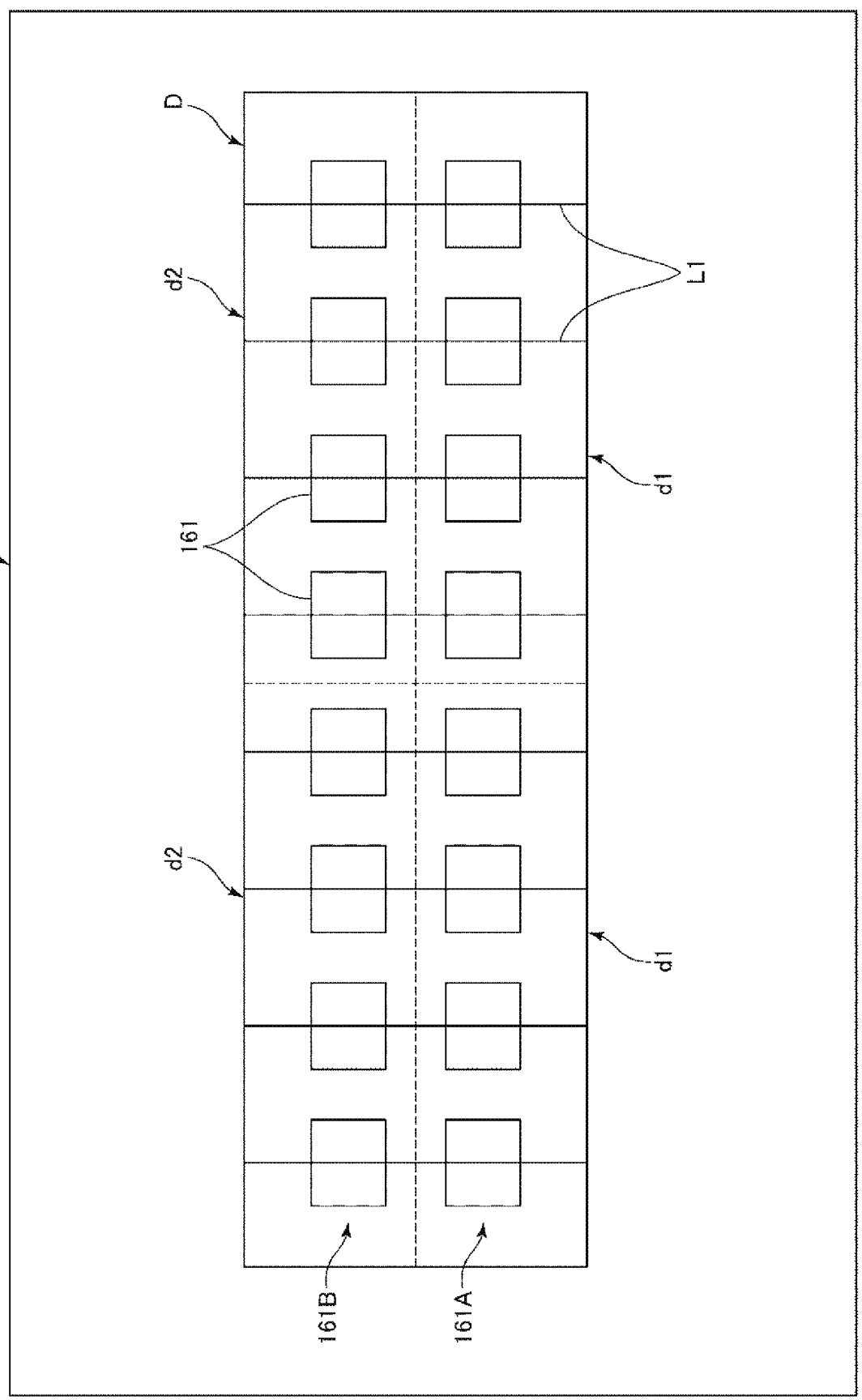
FIG. 19 is a front view of a display unit on which an image obtained by capturing the test unit illustrated in FIG. 18 is displayed.

Further, in a case of detecting the remaining state, that is, detecting that the IC device 90 unintentionally remains in the recess portion 161, in the electronic component handler 10, the control unit 800 displays the above-described image d1 (first image) and the image d2 (second image) on the monitor 300 (refer to FIG. 19). At this time, in the embodiment, a composite image D obtained by combining the image d1 (first image) and the image d2 (second image) is displayed on the monitor 300 (display unit). Accordingly, it is possible to display an image in a wider range of the test unit 16 as the composite image D on the monitor 300. Accordingly, the operator can confirm the wider range of the test unit 16 clearly and efficiently. Particularly, in a case of detecting that the IC device 90 is unintentionally remaining in the recess portion 161, the operator can confirm the periphery of the recess portion 161 more widely, and can know the situation of the test unit 16 more clearly.

In addition, "composite" in the specification means to perform processing of joining the plurality of images so as to form a smaller number of images or superimposing at least one part thereof.

In addition, as described above, the test unit 16 (electronic component placing unit) is arranged in rows and columns and has the plurality of recess portions 161 for accommodating the electronic components therein. In addition, the image d1 (first image) and the image d2 (second image) are images obtained by capturing the rows different from each other among the rows (the row 161A and the row 161B) of the recess portion 161, respectively. Accordingly, it is possible to display the images of the rows different from each other of the recess portion 161 on the monitor 300.

In addition, as described above, the test unit 16 (electronic component placing unit) is the test unit 16 that can test the IC device 90 (electronic component) placed thereon. Accordingly, the operator can confirm the wider range of the test unit 16 clearly and efficiently. Accordingly, in a case of detecting that the IC device 90 is unintentionally remaining in the recess portion 161, the operator can confirm the periphery of the recess portion 161 more widely, and can know the situation of the test unit 16 more clearly. As a result, it is possible to promptly deal with the abnormality by observing the recess portion 161 in which the IC device 90 remains unintentionally or the periphery thereof. Therefore, this contributes to improvement of throughput. Furthermore, it is possible to prevent the plurality of IC devices 90 from being stacked and placed in the recess portion 161. As a result, it is possible to accurately perform the test.

Figure 20:
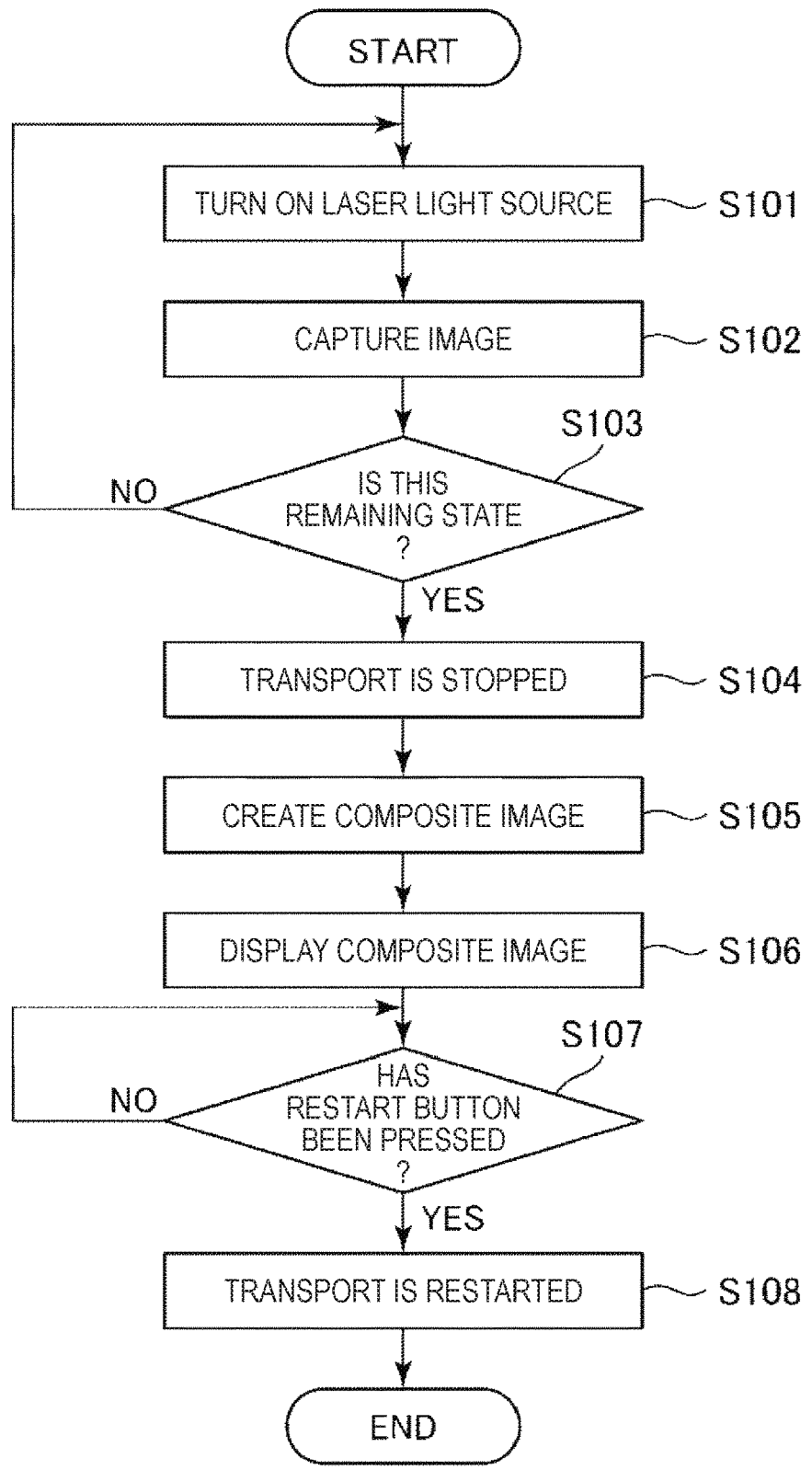
FIG. 20 is a flowchart illustrating a control operation of a control unit included in the electronic component tester illustrated in FIG. 1.

Next, the control operation of the control unit 800 will be described based on the flowchart illustrated in FIG. 20. First, in step S101, the laser light source 41 is operated to irradiate each of the recess portions 161 with laser light L1 (refer to FIG. 5).

Next, in step S102, the test unit 16 is captured by using the first camera 31. Accordingly, the image D1 can be obtained as illustrated in FIG. 12 or FIG. 13. In addition, the capturing in step S102 is performed in the state where the capturing is possible illustrated in FIGS. 16 and 17. When the capturing is completed, emission of the laser light L1 is stopped.

Next, in step S103, it is determined whether the state is the remaining state or the removal state. In the embodiment, the image D2 having the shift amount ΔD2 is acquired in advance and stored in the memory 802, and whether the state is the remaining state or the removed state is determined based on the shift amount of the laser light L1 in the image D2.

In step S103, in a case where it is determined that the state is the remaining state, the operation of the device transport head 17 is stopped in step S104. In addition, in step S105, the composite image D illustrated in FIG. 19 is created, and in step S106, the composite image D of the monitor 300 is displayed. Accordingly, the operator can confirm the wider range of the test unit 16 clearly and efficiently. Particularly, in a case of detecting that the IC device 90 is unintentionally remaining in the recess portion 161, the operator can confirm the periphery of the recess portion 161 more widely, and can know the situation of the test unit 16 more clearly.

In addition, in steps S104 to S106, it may be notified that the state is the remaining state. The notification is performed by operating the notification unit 24. By the notification, the operator can remove the IC device 90 of the test unit 16 and can eliminate the remaining state. In addition, for example, the operator can push a transport restart button through an operation panel 700.

In addition, in step S107, in a case where it is determined that the restart button has been pressed, the transport is restarted in step S108.

As described above, in the configuration in which the capturing is performed via the space between the device transport head 17A and the device transport head 17B, it is difficult to capture the entire area of the test unit 16, and the capturing range is relatively narrow. In the electronic component handler 10, the image d1 obtained by capturing the test unit 16 when the device transport head 17 is positioned at the first position P1 and the image d2 obtained by capturing the test unit when the device transport head 17 is positioned at the second position P2, are displayed on the monitor 300. Accordingly, it is possible to display an image in a wider range of the test unit 16 on the monitor 300. Therefore, the operator can confirm the wider range of the test unit 16.

Second Embodiment

Hereinafter, a second embodiment of the electronic component handler and the electronic component tester according to the invention will be described with reference to FIGS. 21 to 24, but the description will focus on a point different from the above-described embodiment, and the description of the same contents will be omitted.

The embodiment is similar to the first embodiment except for the configuration of a screen displayed on the monitor.

Figure 21:
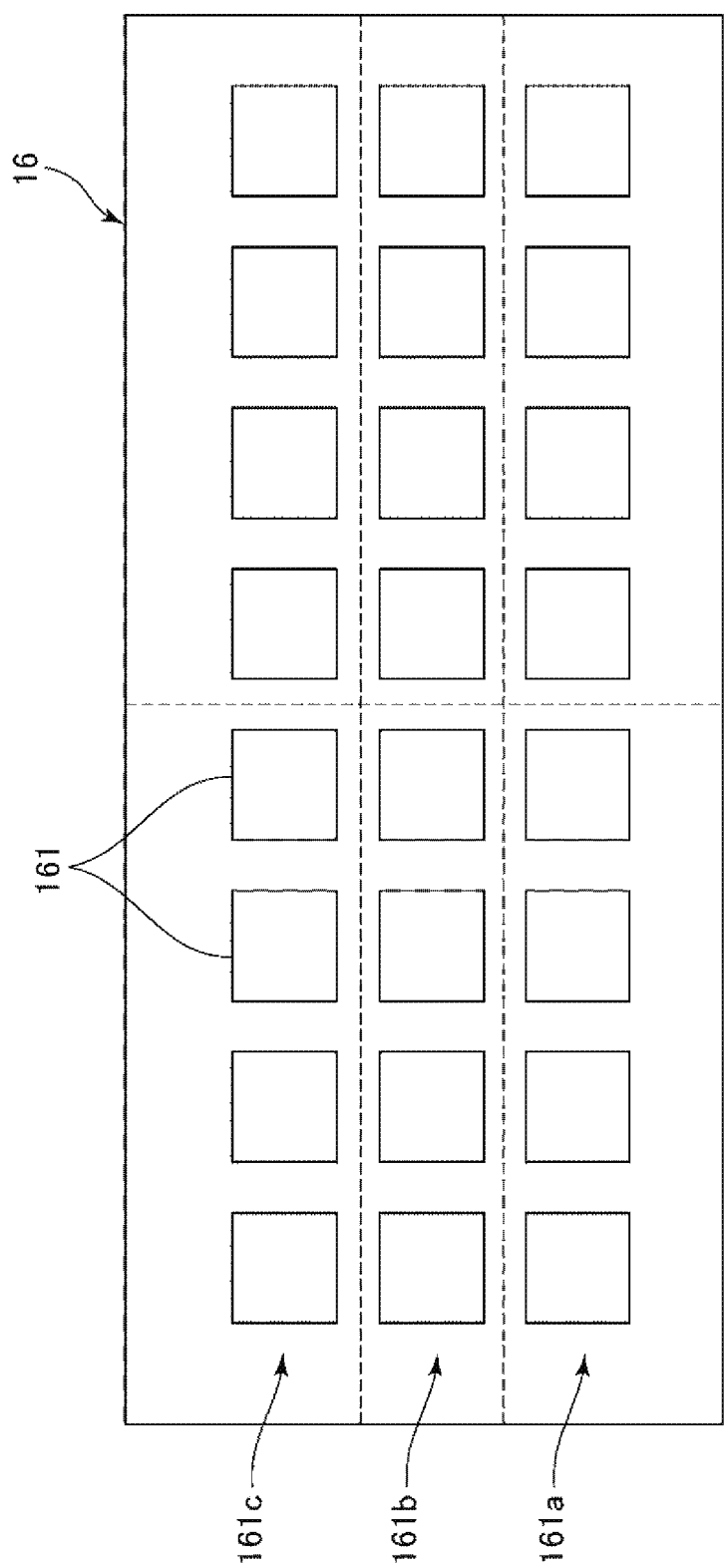
FIG. 21 is a plan view of a test unit provided in a test region of a second embodiment of the electronic component tester according to the invention.

As illustrated in FIG. 21, in the embodiment, each of the recess portions 161 of the test unit 16 can be divided into a row 161a, a row 161b, and a row 161c of 8 recess portions 161 arranged along the X direction. The row 161a, the row 161b, and the row 161c are arranged in this order from the −Y direction.

In addition, in the embodiment, the capturing unit 3 of the detection unit 2A can capture the eight recess portions 161 on the +X side of the row 161a and the row 161b when the device transport head 17 is positioned at the first position P1, and can capture the eight recess portions 161 on the +X side of the row 161b and the row 161c when the device transport head 17 is positioned at the second position P2.

In addition, the capturing unit 3 of the detection unit 2B can capture the eight recess portions 161 on the −X side of the row 161a and the row 161b when the device transport head 17 is positioned at the first position P1, and can capture the eight recess portions 161 on the −X side of the row 161b and the row 161c when the device transport head 17 is positioned at the second position P2.

Figure 22:
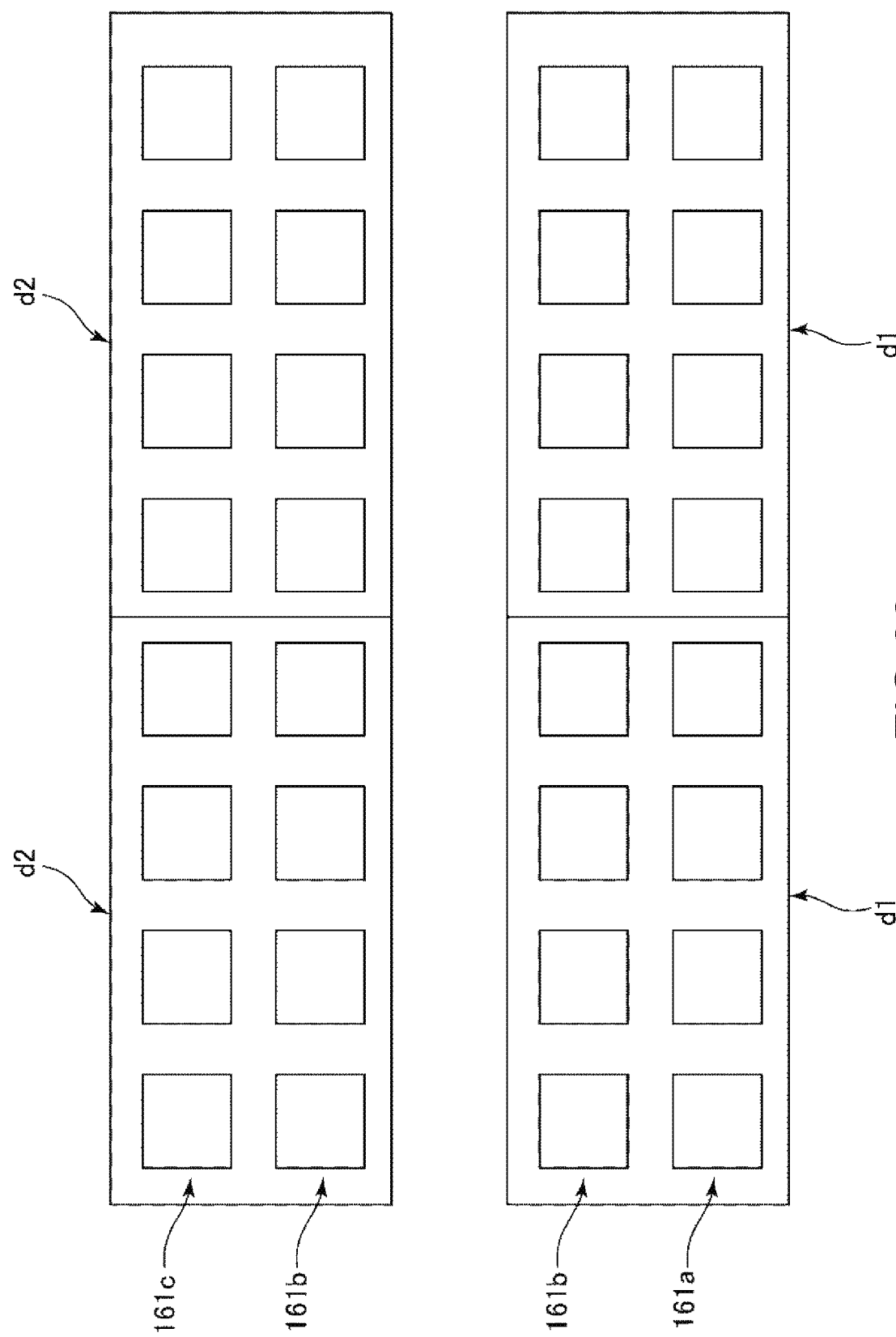
FIG. 22 is a view illustrating a first image and a second image obtained by capturing the test unit illustrated in FIG. 21 by a capturing unit.
Figure 23:
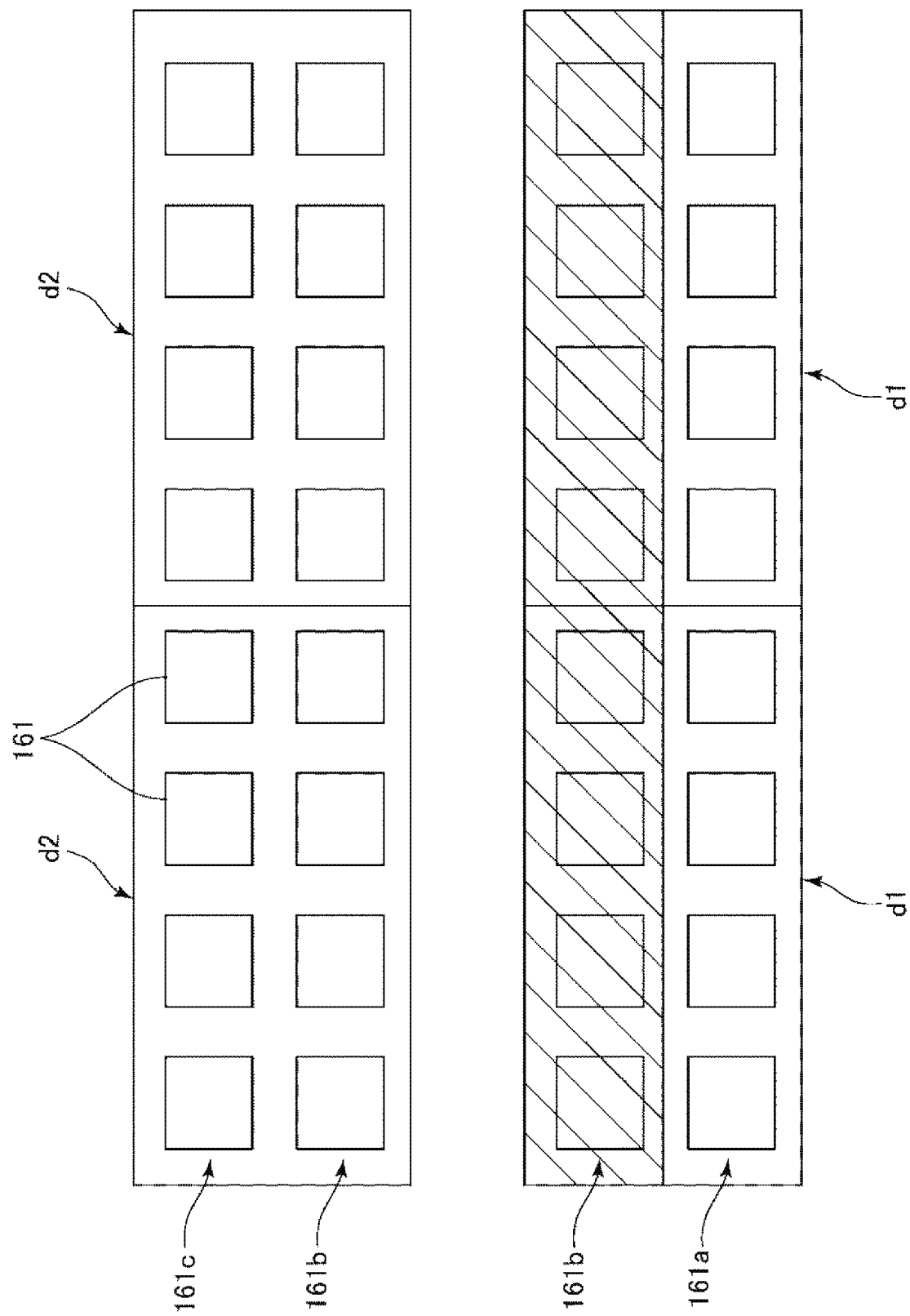
FIG. 23 is a view illustrating the first image and the second image obtained by capturing the test unit illustrated in FIG. 21 by the capturing unit.

Further, as illustrated in FIG. 22, in the image d1 captured by the capturing unit 3 of the detection unit 2A, 8 recess portions 161 on the +X side of the row 161a and the row 161b are taken, and in the image d1 captured by the capturing unit 3 of the detection unit 2B, 8 recess portions 161 on the −X side of the row 161a and the row 161b are taken.

Further, in the image d2 captured by the capturing unit 3 of the detection unit 2A, 8 recess portions 161 on the +X side of the row 161b and the row 161c are taken, and in the image d2 captured by the capturing unit 3 of the detection unit 2B, 8 recess portions 161 on the −X side of the row 161b and the row 161c are taken.

In this manner, in the image d1 and the image d2, the row 161b of the recess portion 161 is commonly taken.

In the embodiment, in a case where the same part (the row 161b of the recess portion 161) of the test unit 16 (electronic component placing unit) is taken in the image d1 (first image) and the image d2 (second image), the control unit 800 (processor) removes the same part (the row 161b of the recess portion 161) in any one of the image d1 (first image) and the image d2 (second image) and displays the image. In other words, the control unit 800 removes the part at which the row 161b of the recess portion 161 of one image (image d1 in the embodiment) of the image d1 (first image) and the image d2 (second image) is taken and displays the image (refer to hatching in FIG. 23). Accordingly, it is possible to display the state where the unnecessary part is removed on the monitor 300. Accordingly, the situation of the test unit 16 can be displayed to the operator more easily.

Figure 24:
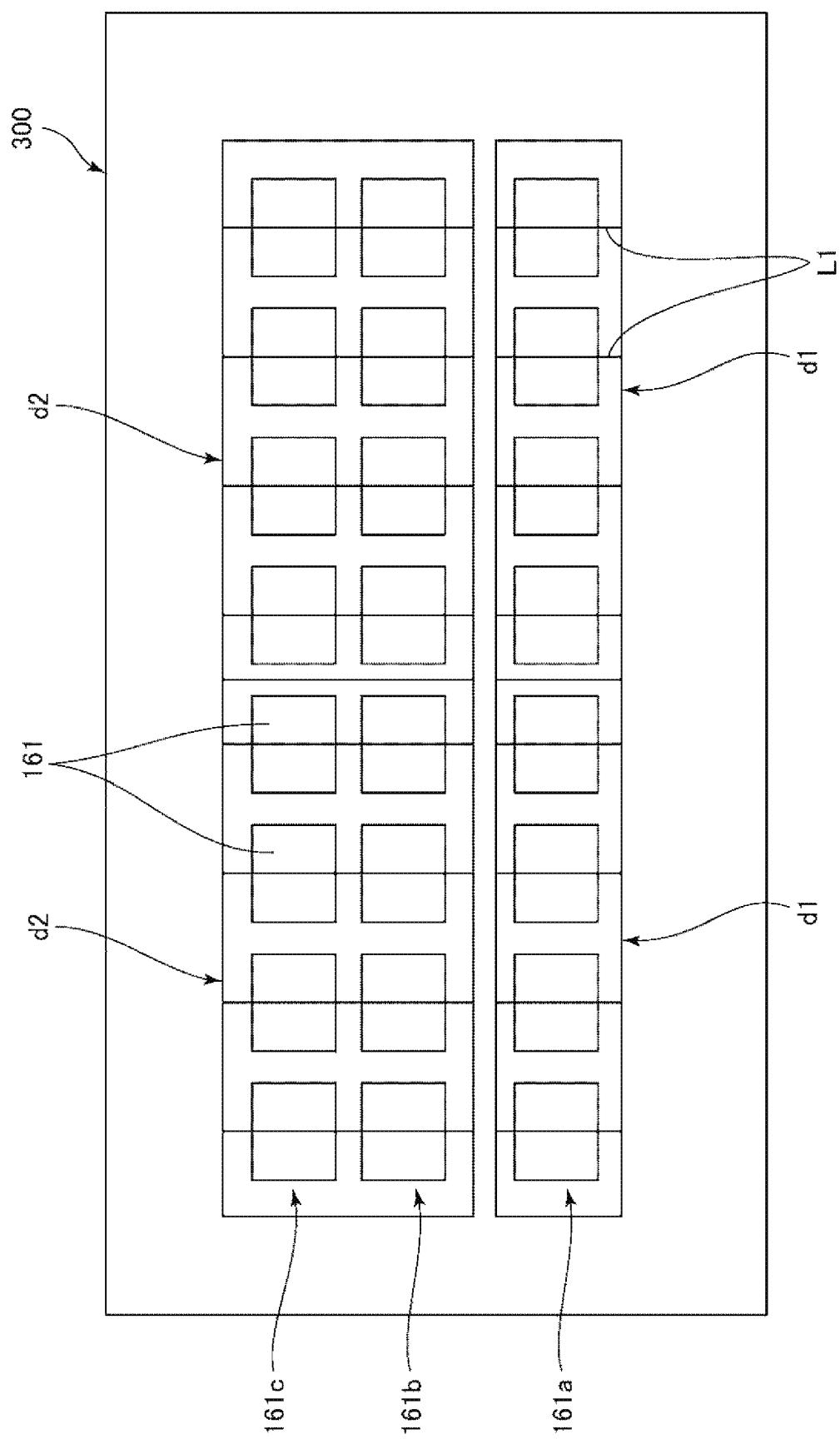
FIG. 24 is a front view of the display unit on which the image obtained by capturing the test unit illustrated in FIG. 21 is displayed.

Further, as illustrated in FIG. 24, in the embodiment, the control unit 800 (processor) separately displays the image d1 (first image) and the image d2 (second image) side by side on the monitor 300 (display unit). In other words, the processing of the image d1 and the image d2 is omitted, and the image d1 and the image d2 are simply arranged and displayed. Accordingly, it is possible to display an image in a wider range of the test unit 16 by a simple control on the monitor 300. Therefore, the operator can confirm the wider range of the test unit 16.

Third Embodiment

Hereinafter, a third embodiment of the electronic component handler and the electronic component tester according to the invention will be described with reference to FIGS. 25 to 27, but the description will focus on a point different from the above-described embodiments, and the description of the same contents will be omitted.

The embodiment is similar to the second embodiment except for the configuration of the screen displayed on the monitor.

Figure 26:
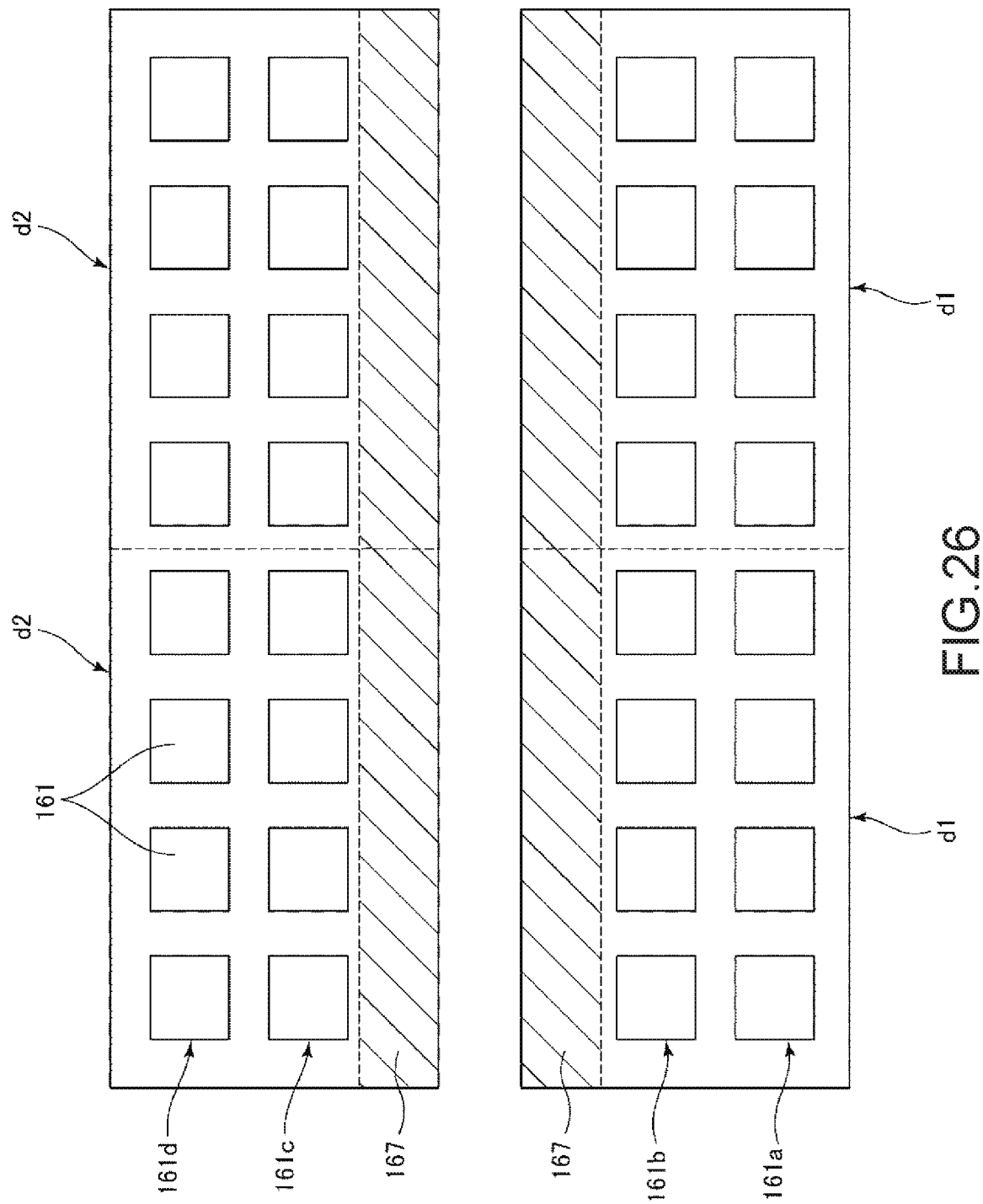
FIG. 26 is a view illustrating the first image and the second image obtained by capturing the test unit illustrated in FIG. 25 by the capturing unit.
Figure 27:
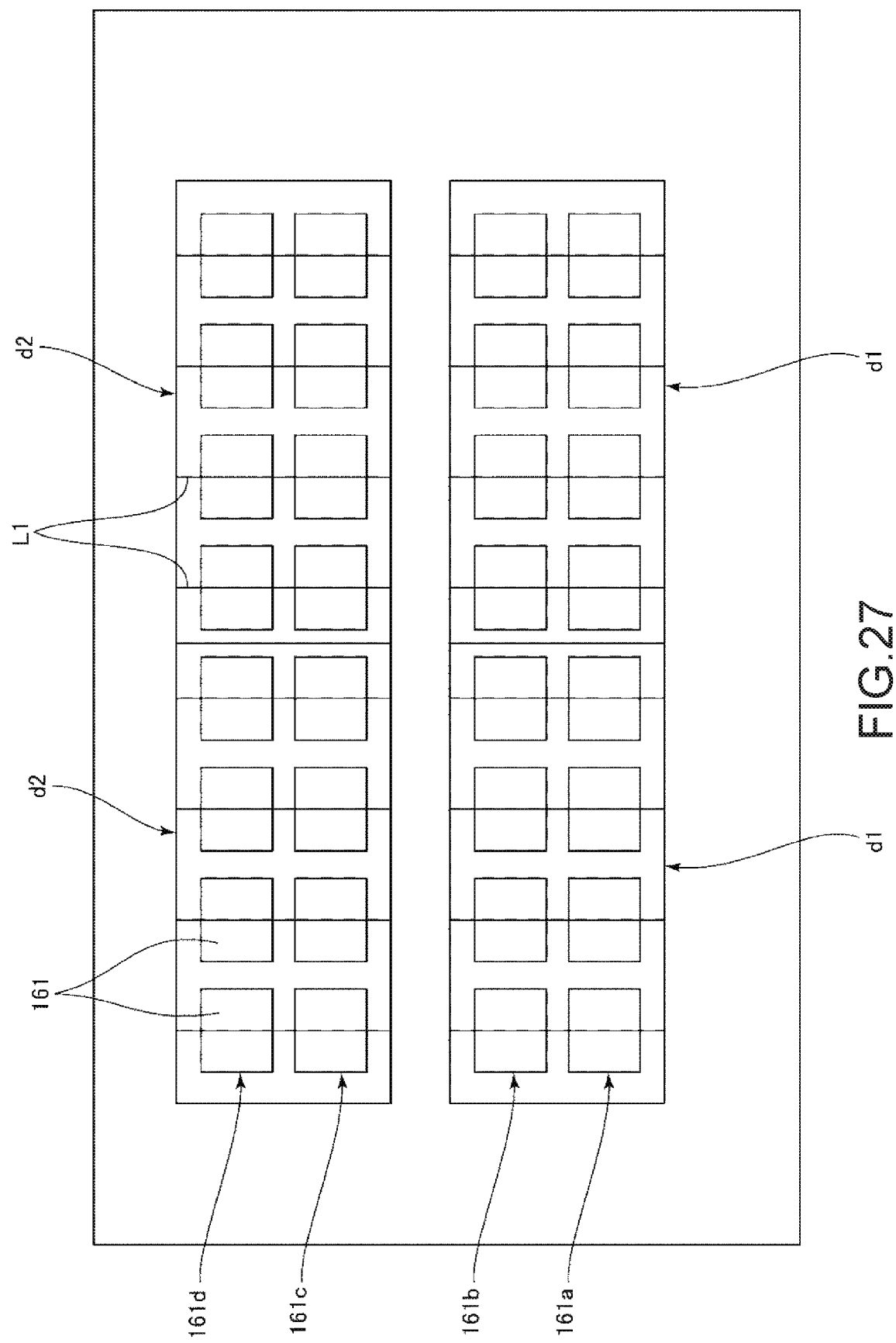
FIG. 27 is a front view of the display unit on which the image obtained by capturing the test unit illustrated in FIG. 25 is displayed.

As illustrated in FIG. 26, in the embodiment, each of the recess portions 161 of the test unit 16 can be divided into the row 161a, the row 161b, the row 161c, and a row 161d of 8 recess portions 161 arranged along the X direction. The row 161a, the row 161b, the row 161c, and the row 161d are arranged in this order from the −Y direction.

In addition, in the embodiment, a margin portion 167 is formed between the row 161b and the row 161c of the recess portion 161, and the separation distance between the row 161b and the row 161c is greater than the separation distance between the row 161a and the row 161b or the separation distance between the row 161c and the row 161d.

In addition, in the embodiment, the capturing unit 3 of the detection unit 2A can capture the eight recess portions 161 on the +X side of the row 161a and the row 161b when the device transport head 17 is positioned at the first position P1, and can capture the eight recess portions 161 on the +X side of the row 161c and the row 161d when the device transport head 17 is positioned at the second position P2.

In addition, the capturing unit 3 of the detection unit 2B can capture the eight recess portions 161 on the −X side of the row 161a and the row 161b when the device transport head 17 is positioned at the first position P1, and can capture the eight recess portions 161 on the −X side of the row 161c and the row 161d when the device transport head 17 is positioned at the second position P2.

Figure 25:
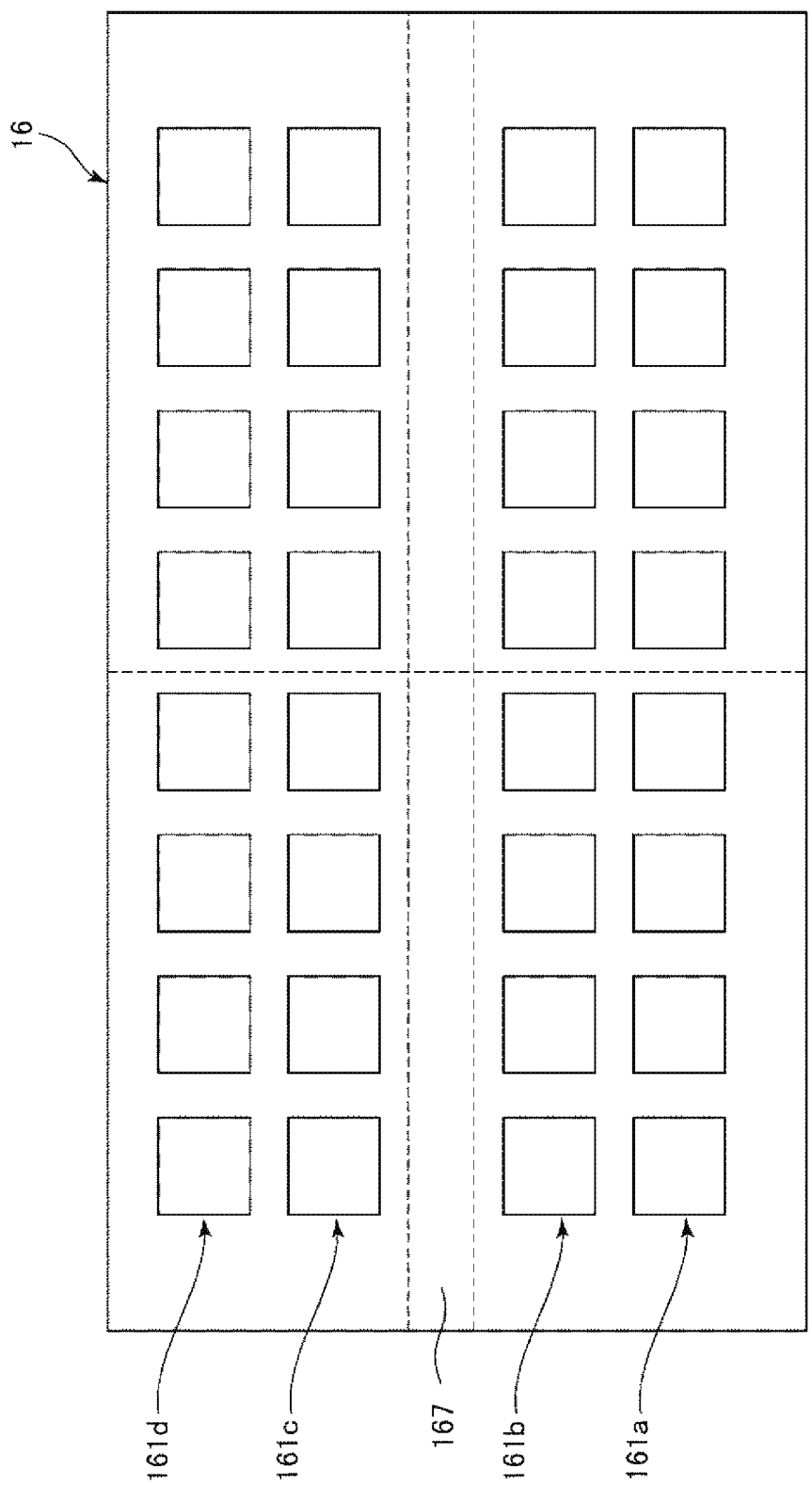
FIG. 25 is a plan view of a test unit of a third embodiment of the electronic component tester according to the invention.

Further, as illustrated in FIG. 25, in the image d1 captured by the capturing unit 3 of the detection unit 2A, 8 recess portions 161 on the +X side of the row 161a and the row 161b are taken, and in the image d1 captured by the capturing unit 3 of the detection unit 2B, 8 recess portions 161 on the −X side of the row 161a and the row 161b are taken.

Further, in the image d2 captured by the capturing unit 3 of the detection unit 2A, 8 recess portions 161 on the +X side of the row 161c and the row 161d are taken, and in the image d2 captured by the capturing unit 3 of the detection unit 2B, 8 recess portions 161 on the −X side of the row 161c and the row 161d are taken.

In addition, in the image d1 and the image d2, the margin portion 167 is commonly taken.

In the embodiment, in a case where the same part (margin portion 167) of the test unit 16 (electronic component placing unit) is taken in the image d1 (first image) and the image d2 (second image), the control unit 800 (processor) removes the same part (margin portion 167) in both of the image d1 (first image) and the image d2 (second image) and displays the image (refer to FIG. 26). In other words, the control unit 800 removes the part at which the margin portion 167 of both of the images of the image d1 (first image) and the image d2 (second image) is taken (refer to hatching in FIG. 26). Accordingly, as illustrated in FIG. 27, it is possible to display the state where the unnecessary part is removed on the monitor 300. Accordingly, the situation of the test unit 16 can be displayed to the operator more easily.

Fourth Embodiment

Figure 28:
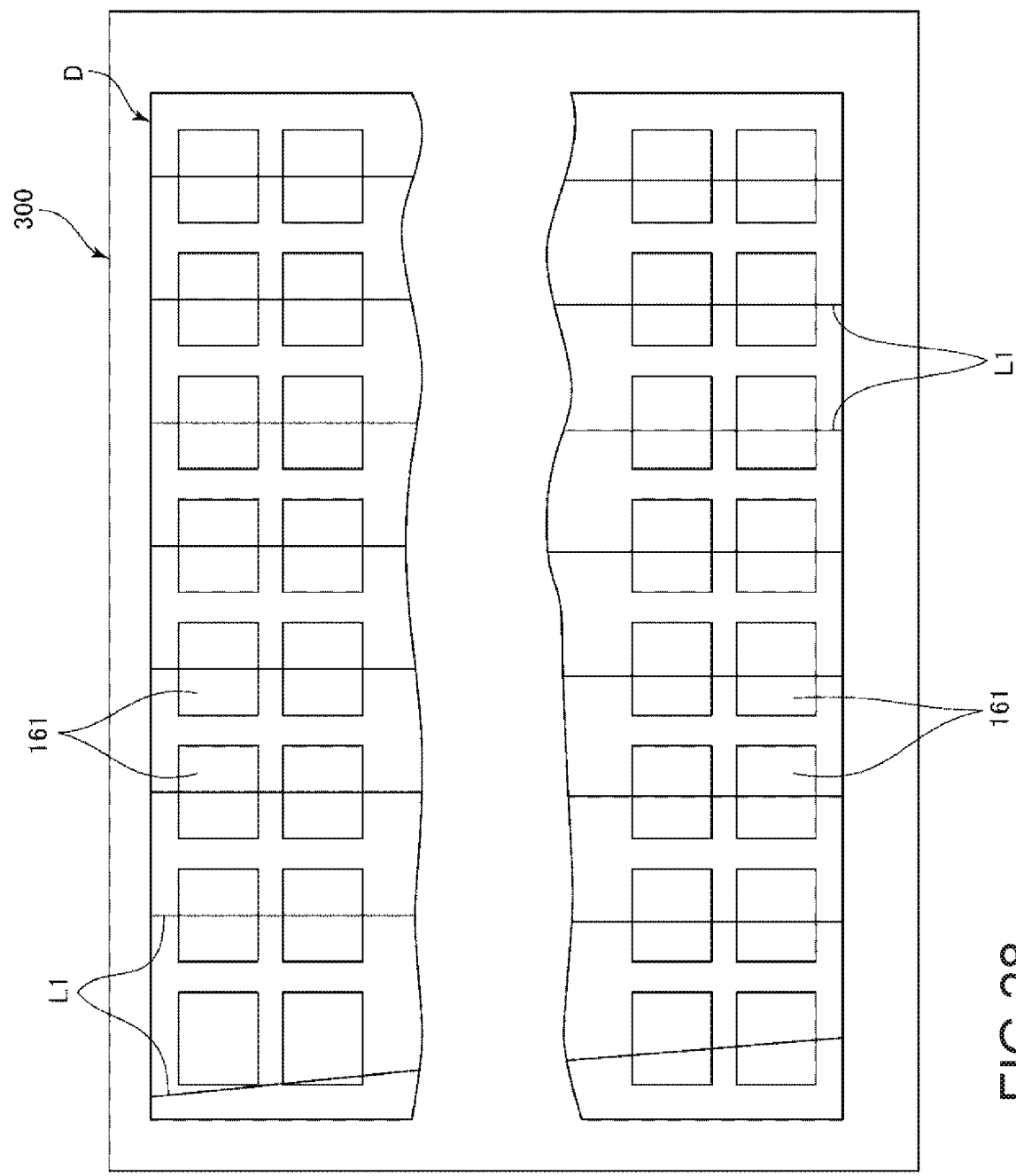
FIG. 28 is a front view of a display unit on which an image obtained by capturing a test unit of a fourth embodiment of the electronic component tester according to the invention is displayed.

Hereinafter, a fourth embodiment of the electronic component handler and the electronic component tester according to the invention will be described with reference to FIG. 28, but the description will focus on a point different from the above-described embodiments, and the description of the same contents will be omitted.

The embodiment is similar to the first embodiment except that the configuration of the test unit and the control operation of the control unit are mainly different.

Depending on the type of the IC device 90, for example, there is a case where the test unit 16 has a different disposition number of the recess portions 161 or disposition form (pitch between the recess portions 161 arranged in the X direction, and the like). In this case, it is necessary to adjust the irradiation direction of the laser light L1 directed toward the recess portion 161. As a method of adjusting the irradiation direction, there are a method of directly touching the light reflection unit 33 to manually change the posture of the light reflection unit 33, a method of changing the posture of the light reflection unit 33 by operating the screen with the operation panel 700, and the like.

In addition, when the adjustment is completed, the composite image D is displayed on the monitor 300 at any timing. In addition, adjustment may be performed while viewing the composite image D displayed on the monitor 300.

The light L1 has an elongated irradiation shape, and the composite image D is composed by combining the image d1 (first image) and the image d2 (second image) with each other along the longitudinal direction (Y direction) of the irradiation shape in the image d1 (first image) and the image d2 (second image). Accordingly, it is possible to obtain the same effects as those in the first embodiment. Furthermore, as illustrated in FIG. 28, for example, in a case where the leftmost laser light L1 in the drawing is obliquely emitted, depending on the number of the recess portions 161 or the size of the test unit 16, a state where light L1 is not emitted into the recess portion 161 can occur. For example, in a case where only the recess portion 161 on the lower side in FIG. 28 is displayed on the monitor 300, there is a possibility that the recess portion 161 on the upper side in FIG. 28 overlooks that the laser light L1 is not emitted into the recess portion 161. Meanwhile, in the electronic component handler 10, since the entire composite image D is displayed on the monitor 300, overlooking described above can be prevented. Accordingly, the irradiation direction of the laser light L1 can be more accurately and more reliably adjusted.

In this manner, display on the monitor 300 (display unit) is performed prior to determination (determination processing). Accordingly, even when the test is started, it is possible to prevent the plurality of IC devices 90 from being stacked and placed in the recess portion 161, and to accurately perform the test.

Fifth Embodiment

Hereinafter, a fifth embodiment of the electronic component handler and the electronic component tester according to the invention will be described with reference to FIG. 29, but the description will focus on a point different from the above-described embodiments, and the description of the same contents will be omitted.

The embodiment is similar to the first embodiment except that a marker and a display unit are provided in the test unit.

Figure 29:
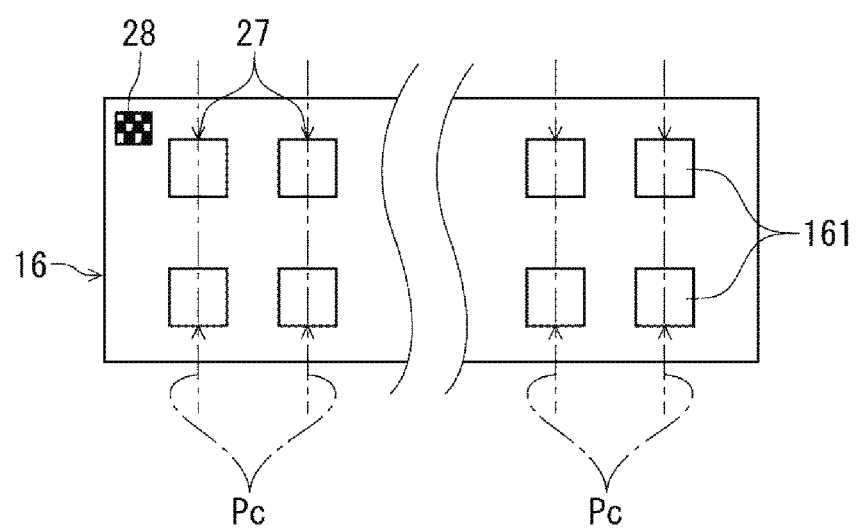
FIG. 29 is a plan view of a test unit of a fifth embodiment of the electronic component tester according to the invention.

As illustrated in FIG. 29, in the embodiment, a marker 27 and a display unit 28 are provided on the upper surface of the test unit 16.

The marker 27 is provided at an edge portion of each of the recess portions 161 and indicates a center position Pc in the X direction of the recess portion 161. By adjusting the irradiation position of the laser light L1 in accordance with the marker 27, the adjustment process of the irradiation position of the laser light L1 can be simplified.

Further, the display unit 28 is configured by, for example, a two-dimensional barcode. After the adjustment process of the irradiation position of the laser light L1 is completed, it is possible to read the display unit 28 and to store the irradiation position of the laser light L1 and the information of the display unit 28 together in the memory 802. Accordingly, for example, even when the test unit 16 having different disposition form of the recess portion 161 is used for each test, by reading the display unit 28, the irradiation position of the laser light L1 can be known. In other words, the reproducibility of the irradiation position of the laser light L1 can be improved. Accordingly, the irradiation position of the laser light L1 can be simply adjusted.

Sixth Embodiment

Hereinafter, a sixth embodiment of the electronic component handler and the electronic component tester according to the invention will be described with reference to FIG. 30, but the description will focus on a point different from the above-described embodiments, and the description of the same contents will be omitted.

The embodiment is similar to the first embodiment except for the emission timing of the light.

In the embodiment, the laser light source 41 intermittently irradiates the laser light L1. In other words, the laser light source 41 alternately repeats irradiation and stop of the laser light L1. Further, the laser power in the embodiment is set in accordance with IEC 60825-1: 2014 and JIS C 6802: 2014. Accordingly, the safety of the operator is ensured.

Figure 30:
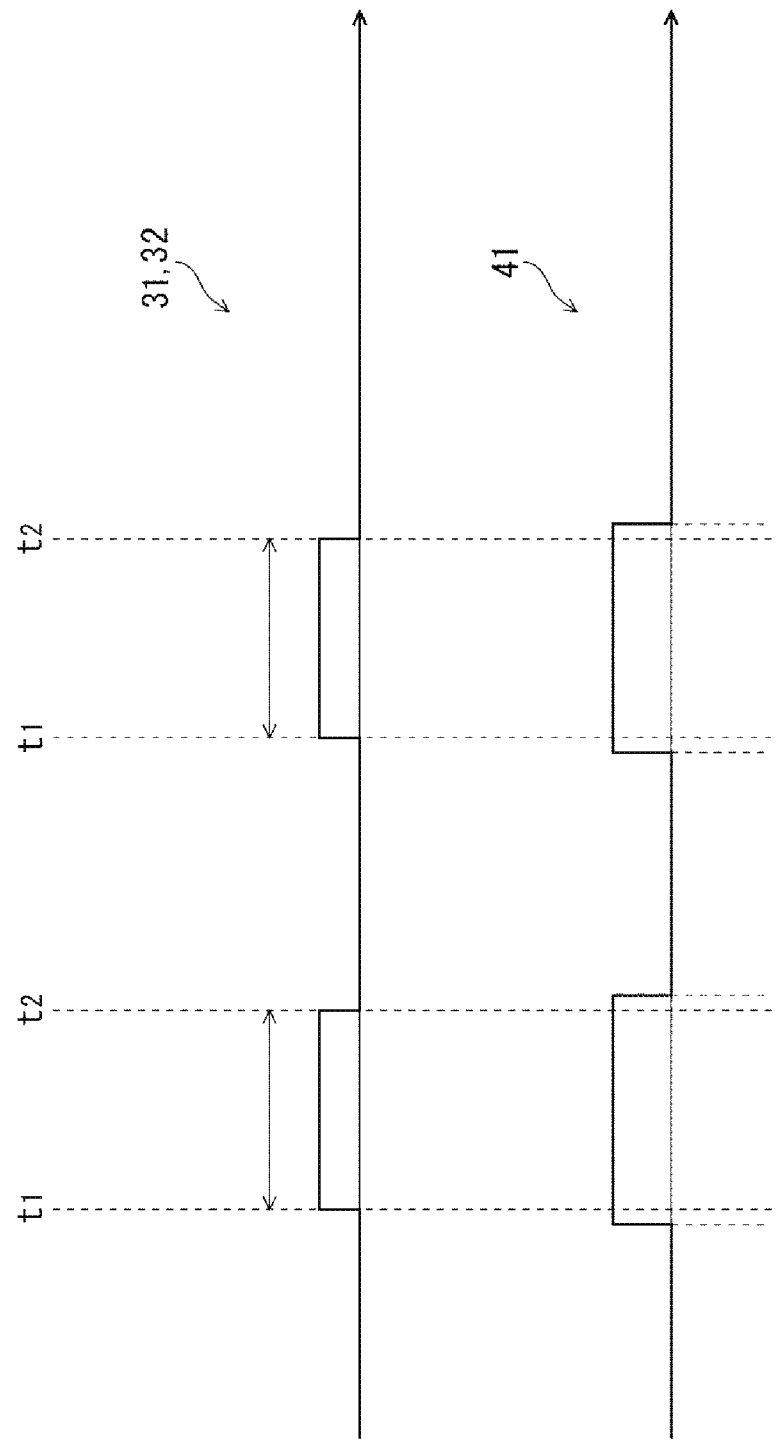
FIG. 30 is a timing chart of a light irradiation unit and a capturing unit in a sixth embodiment of the electronic component tester according to the invention.

In the timing chart illustrated in FIG. 30, the chart on the upper side in the drawing illustrates the first camera 31 and the second camera 32, and the chart on the lower side in the drawing illustrates the laser light source 41. As illustrated in FIG. 30, in the embodiment, the laser light source 41 which is the light irradiation unit emits the laser light L1 before a capturing start time t1 and stops the emission of the laser light L1 after a capturing completion time t2. Accordingly, while the first camera 31 is captured, it is possible to achieve a state where the test unit 16 is irradiated with the laser light L1.

Furthermore, by configuring the laser light source 41 which is the light irradiation unit to emit the laser light L1 when the capturing is possible, it is possible to prevent the capturing of the test unit when the test unit is shielded by the device transport head 17. Accordingly, the capturing can be performed without waste.

Seventh Embodiment

Hereinafter, a seventh embodiment of the electronic component handler and the electronic component tester according to the invention will be described with reference to FIGS. 31 and 32, but the description will focus on a point different from the above-described embodiment, and the description of the same contents will be omitted.

The embodiment is similar to the first embodiment except that the control operation of the control unit and the disposition form of the recess portion of the test unit are different.

Figure 31:
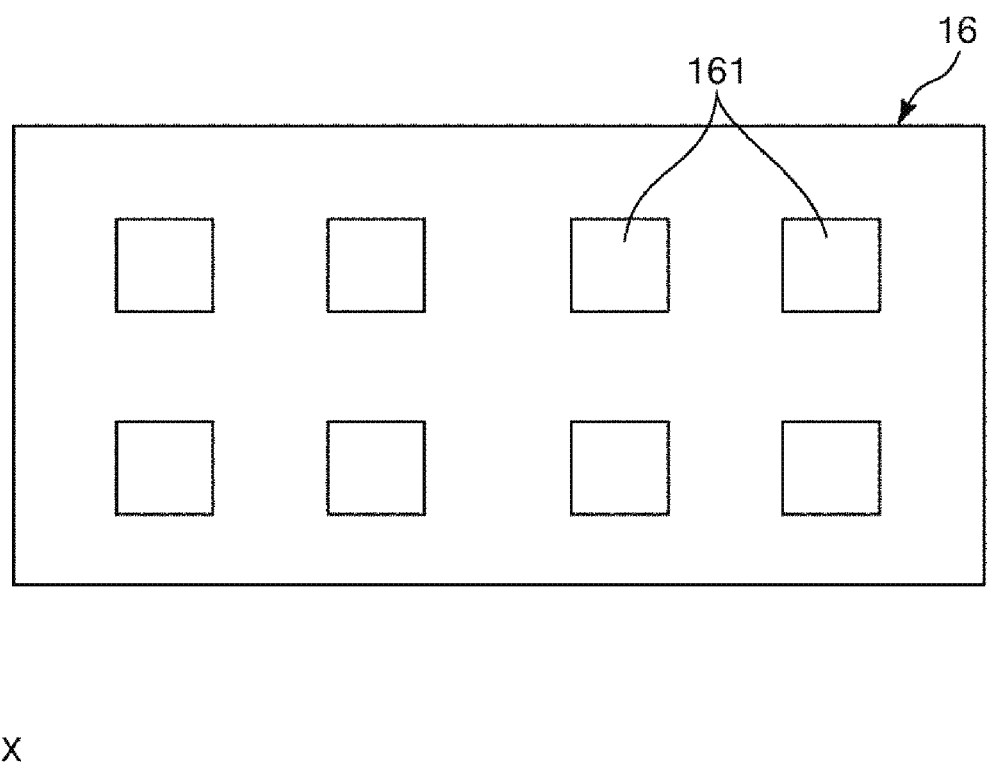
FIG. 31 is a plan view of a test unit of a seventh embodiment of the electronic component tester according to the invention.
Figure 32:
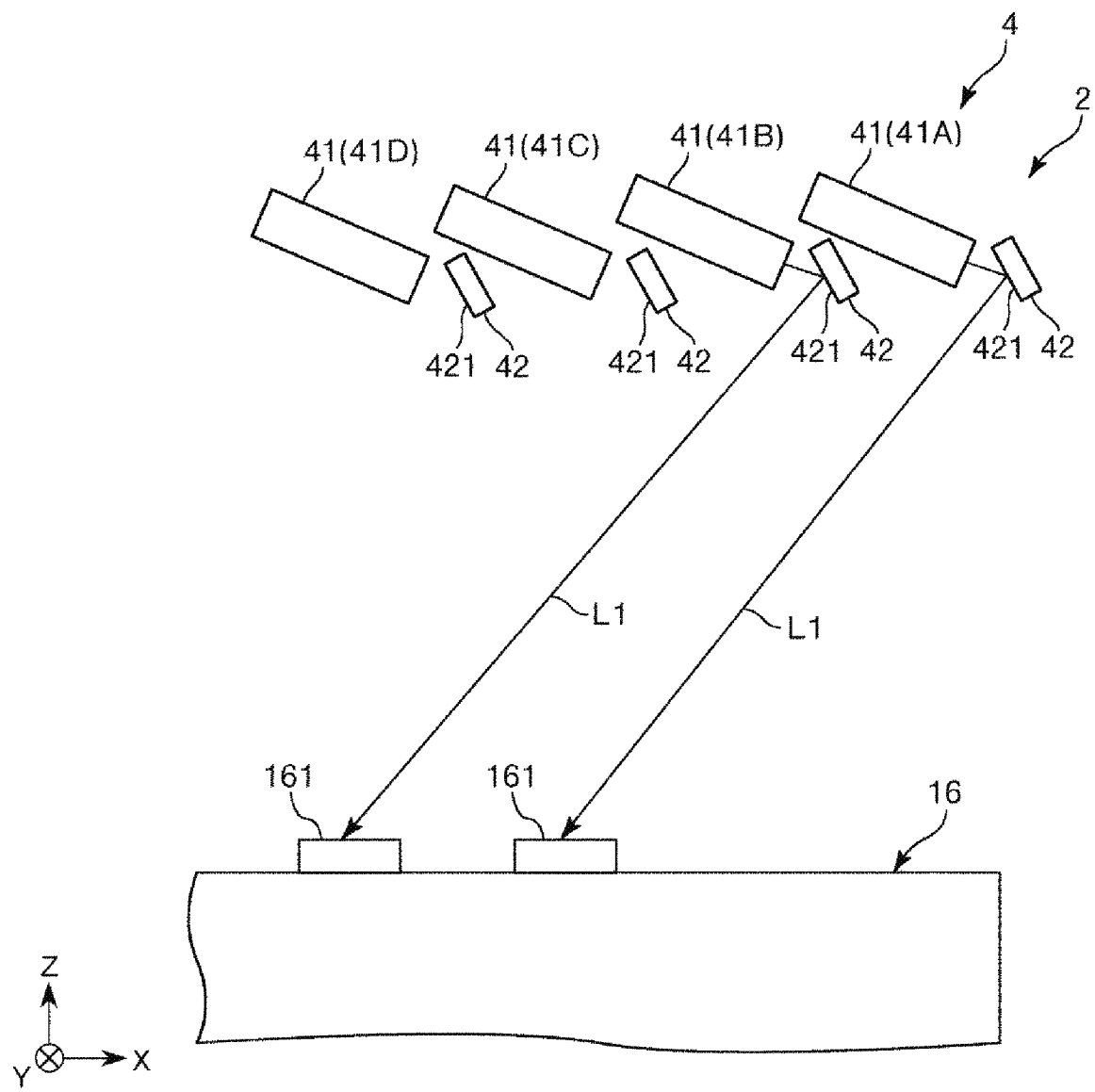
FIG. 32 is a side view of a light irradiation unit in the seventh embodiment of the electronic component tester according to the invention.

As illustrated in FIG. 31, in the embodiment, 8 recess portions 161 are provided in the test unit 16. In the test unit 16, 4 recess portions 161 are arranged in a row in the X direction, and 4 recess portions 161 are further arranged in a row on the +Y side of the row.

In the test unit 16, the detection unit 2A is responsible for the irradiation and the capturing of the laser light L1 in the four recess portions 161 on the +X side from the center in the X direction of the test unit 16, and the detection unit 2B is responsible for the irradiation and the capturing of the laser light L1 in the four recess portions 161 on the −X side from the center in the X direction of the test unit 16. Hereinafter, the detection unit 2A and the four recess portions 161 on the +X side from the center in the X direction of the test unit 16 will be representatively described.

As described in the first embodiment, in the detection unit 2A, the four laser light sources 41 are provided, and two recess portions 161 arranged in the Y direction are irradiated with the laser light L1 by one laser light source 41. Therefore, in the disposition form of the recess portion 161 as illustrated in FIG. 31, since it is sufficient to operate the two laser light sources 41, in the detection unit 2A, two laser light sources 41 out of the four laser light sources 41 are selected and operated. In addition, the four laser light sources 41 are referred to as a laser light source 41A, a laser light source 41B, a laser light source 41C, and a laser light source 41D in order from the +X side.

During the selection, as described above, as the incident angle θ1 of the laser light L1 increases, the determination can be performed more accurately. Therefore, among the detection units 2A, the laser light source 41A on the +X side and the laser light source 41B are selected (refer to FIG. 32).

In addition, for example, in a case where the incident angle θ1 of the laser light L1 of the laser light source 41A is greater than the angle θ2 between the inner circumferential surface 162 of the recess portion 161 and the Z direction, the selection of the laser light source 41A is omitted, and the laser light source 41B and the laser light source 41C are selected (not illustrated).

In this manner, in the embodiment, the laser light source 41 is selected such that the incident angle θ1<the angle θ2 is satisfied and the incident angle θ1 is as large as possible. Accordingly, it is possible to make accurate determination regardless of the disposition form of the recess portions 161 in the test unit 16.

In addition, in the above-described configuration, a configuration in which the laser light source 41A emits the laser light L1 to the recess portion 161 on the +X side and the laser light source 41B emits the laser light L1 to the recess portion 161 on the −X side, is employed, but a configuration in which the laser light source 41A emits the laser light L1 to the recess portion 161 on the −X side and the laser light source 41B emits the laser light L1 to the recess portion 161 on the +X side, may be employed. In addition, even when any two of the laser light sources 41A to 41D are selected, the two laser light sources may emit the laser light L1 to any recess portion 161.

Eighth Embodiment

Hereinafter, an eighth embodiment of the electronic component handler and the electronic component tester according to the invention will be described with reference to FIG. 33, but the description will focus on a point different from the above-described embodiments, and the description of the same contents will be omitted.

The embodiment is similar to the first embodiment except for the disposition form of the recess portion in the test unit and the capturing range of the first capturing unit and the second capturing unit.

Figure 33:
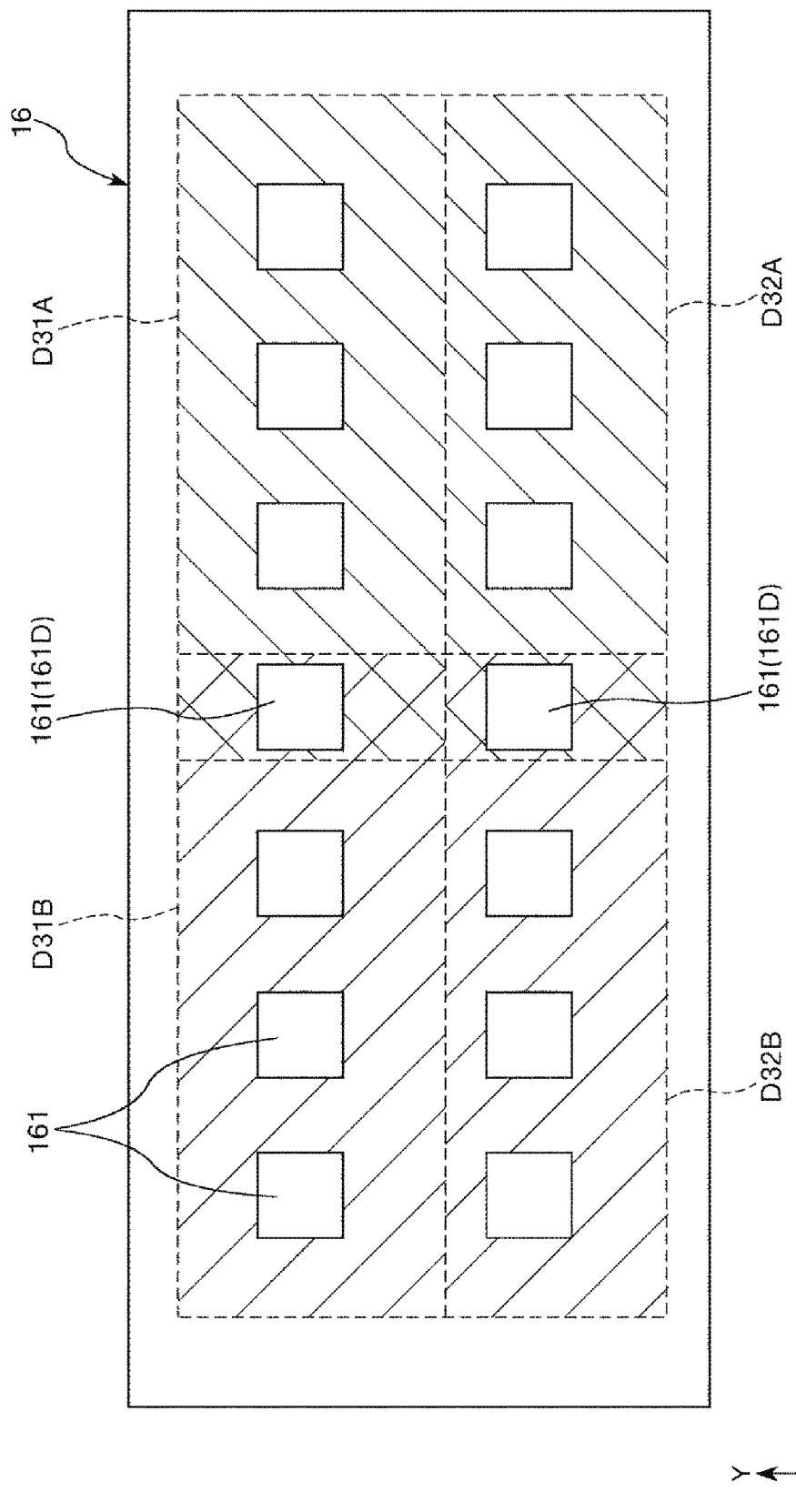
FIG. 33 is a plan view of a test unit in an eighth embodiment of the electronic component tester according to the invention, and is a view illustrating regions captured by a first capturing unit and a second capturing unit.

As illustrated in FIG. 33, in the embodiment, 14 recess portions 161 are provided in the test unit 16. In the test unit 16, 7 recess portions 161 are arranged in a row in the X direction, and 7 recess portions 161 are further arranged in a row on the +Y side of the row. In addition, regarding the recess portion 161, since the uneven number of the recess portions 161 are provided in one row along the X direction, the recess portions 161 are arranged in the center portion in the X direction of the test unit 16.

Further, in the embodiment, there is an overlapping portion in which the capturing ranges of the first camera 31 of the detection unit 2A and the first camera 31 of the detection unit 2B overlap each other. Specifically, the first camera 31 of the detection unit 2A captures the 4 recess portions 161 from the +X side, and the first camera 31 of the detection unit 2B captures the 4 recess portions 161 from the −X side. Therefore, the recess portion 161 (recess portion 161D) in the middle is captured by both of the first camera 31 of the detection unit 2A and the first camera 31 of the detection unit 2B. In other words, the recess portion 161 is also taken in an image D31A captured by the first camera 31 of the detection unit 2A, and is also taken in an image D31B captured by the first camera 31 of the detection unit 2B. In addition, this also applies to an image D32A captured by the second camera 32 of the detection unit 2A and an image D32B captured by the second camera 32 of the detection unit 2B.

According to such a configuration, even in the test unit 16 in which the recess portion 161 is positioned in the center portion in the X direction, it is possible to reliably capture the recess portion 161D positioned in the center portion. In other words, it is possible to prevent the recess portion 161D from being positioned at a boundary between the image D31A and the image D31B (the same applies to the images D32A and D32B). Accordingly, it is possible to accurately determine the presence or absence of the IC device 90 in the recess portion 161.

In addition, the determination in the recess portion 161D can be performed based on at least one of the image D31A and the image D31B (the same applies to the images D32A and D32B).

Further, in a case where a CCD camera is employed as the first camera 31 and the second camera 32, exposure is sequentially performed in the leftward-and-rightward directions in FIG. 33, and reading is sequentially performed in the upward-and-downward direction in FIG. 33. In the embodiment, since the image captured by the first camera 31 and the second camera 32 has a shape of which the longitudinal direction is the leftward-and-rightward direction in the drawing, it is possible to suppress the increase in number of times of reading in the upward-and-downward direction in the drawing. As a result, it is possible to shorten the time required for reading the captured image, and it is possible to smoothly perform the determination based on the image.

Ninth Embodiment

Hereinafter, a ninth embodiment of the electronic component handler and the electronic component tester according to the invention will be described with reference to FIGS. 34 and 35, but the description will focus on a point different from the above-described embodiment, and the description of the same contents will be omitted.

The embodiment is similar to the first embodiment except for the operation of the device transport head.

Figure 34:
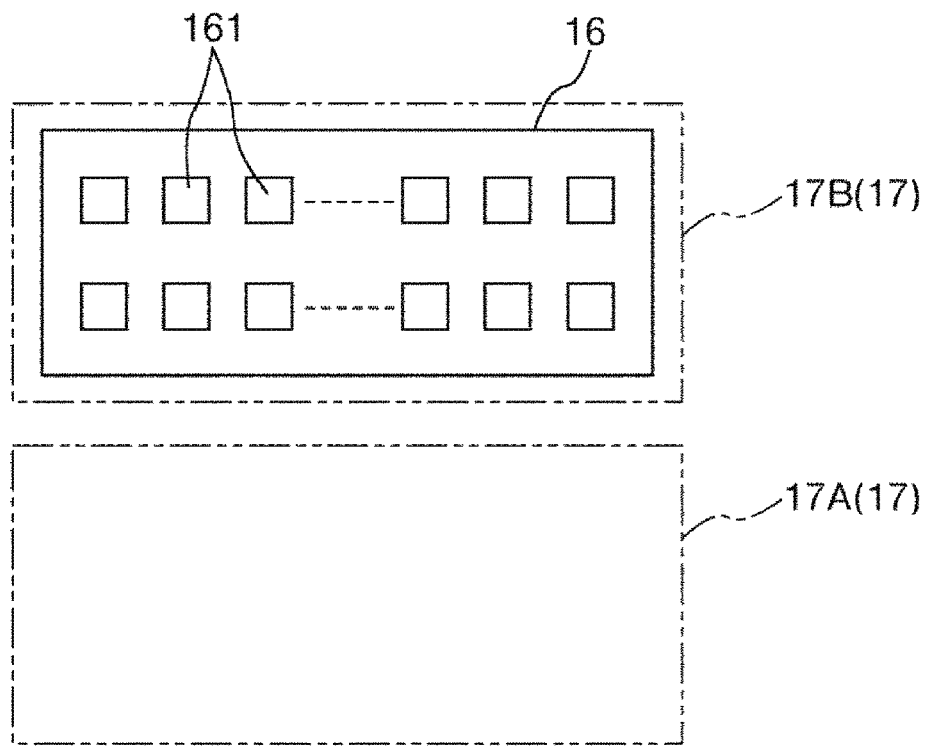
FIG. 34 is a plan view of a test unit of a ninth embodiment of the electronic component tester according to the invention.
Figure 35:
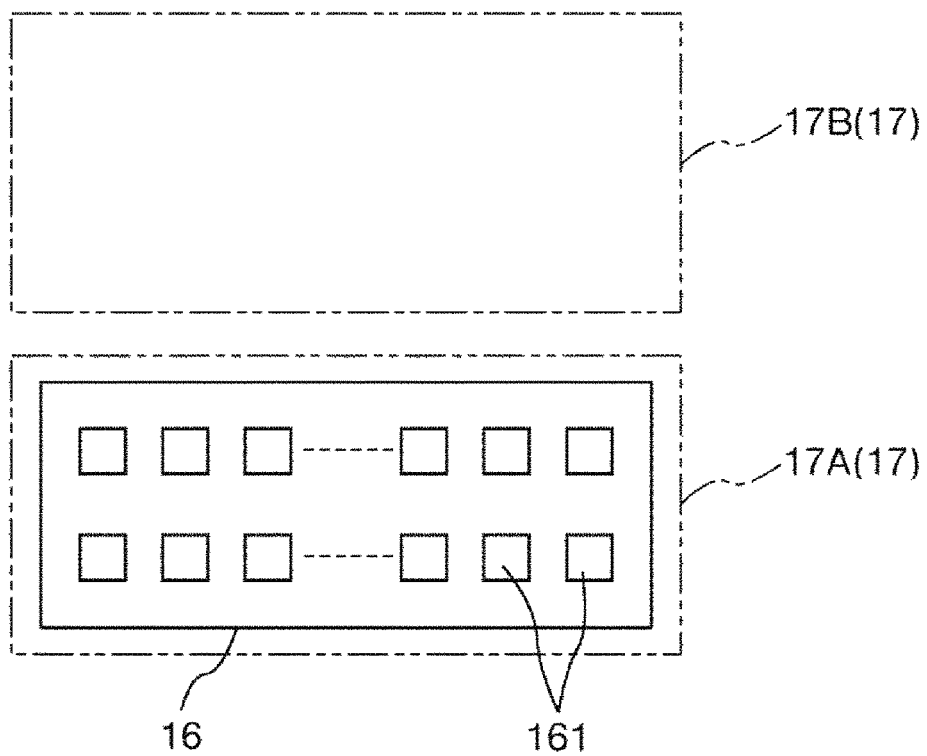
FIG. 35 is a plan view of a test unit of a ninth embodiment of the electronic component tester according to the invention.

As illustrated in FIGS. 34 and 35, in the embodiment, the device transport head 17A and the device transport head 17B respectively have a suction portion (not illustrated) that corresponds to the recess portion 161 of the test unit 16, and alternately transports the IC device (not illustrated) to the test unit 16.

In other words, as illustrated in FIG. 34, when the device transport head 17B is transporting the IC device 90 to the test unit 16, the device transport head 17A is positioned at a position deviated to the −Y side of the test unit 16. Meanwhile, as illustrated in FIG. 35, when the device transport head 17A is transporting the IC device 90 to the test unit 16, the device transport head 17B is positioned at a position deviated to the +Y side of the test unit 16.

In this manner, in the embodiment, one device transport head 17 transports the IC device 90 to the test unit 16, and the transport is repeated alternately.

The ninth embodiment also achieves the same effects as those of the first embodiment.

Above, the electronic component handler and the electronic component tester according to the invention are described using the embodiments illustrated in the drawing, but the invention is not limited thereto, and each portion which configures the electronic component handler and the electronic component tester can be replaced with any configuration that can achieve similar functions. In addition, any configuration member may be added.

In addition, the electronic component handler and the electronic component tester according to the invention may combine any of two or more configurations (characteristics) of each of the embodiments.

In the second embodiment, a configuration in which the row of recess portions common to the first image and the second image is removed from one of the first image and the second image, is employed, and in the third embodiment, a configuration in which the margin portion in the test unit is removed from both of the first image and the second image, is employed. However, the invention is not limited thereto, and for example, a configuration in which a part which is not used in determination (a part other than the recess portion), such as a logo attached to the test unit, is removed, may be employed, or a configuration in which a blurred part, such as an edge portion of the first hand or the second hand is removed, may be employed.

Further, in each of the above-described embodiments, a case where one processor performs the determination processing, the capturing of an image (control of the capturing unit), and the display on a display unit (control of the display unit) has been described, but a plurality of processors may be configured to be responsible for each control.

In addition, although the electronic component placing unit in which the detection of the remaining state is performed is the test unit in each of the embodiments, the invention is not limited thereto, and may be another electronic component placing unit, such as the temperature adjustment unit, the device supply unit, the device collect unit, and the tray for collection.

In addition, in the electronic component handler according to the invention, the capturing unit may capture a full color image or may capture a monochrome image.

In addition, in each of the above-described embodiments, when performing the determination processing, a configuration in which a line of the laser light emitted to the bottom portion of the first recess portion and a line of the laser light emitted to the bottom portion of the second recess portion or the upper surface of the electronic component are compared with each other, that is, a configuration in which the line of the laser light emitted to the bottom portion of the first recess portion is considered as a reference, has been described. However, the invention is not limited thereto, and for example, the line of the laser light emitted to the upper surface of the test unit may be used as a reference.

In addition, in each of the above-described embodiments, a case where a motor is used as the light reflection unit driving unit has been described. However, the invention is not limited thereto, and for example, a solenoid or a micro electro mechanical system (MEMS) structure can be used.

The entire disclosure of Japanese Patent Application No. 2017-127044, filed Jun. 29, 2017 is expressly incorporated by reference herein.

What is claimed is:

1. An electronic component handler comprising:
   a region for accommodating an electronic component support on which an electronic component is placed;
   a transporter having a first hand and a second hand for holding and transporting the electronic component;
   a light source which is configured to emit light toward the electronic component support and configured to adjust an emitting direction of the light;
   a camera which is configured to capture an image of the electronic component support, the electronic component support being irradiated with the light via a space between the first hand and the second hand;
   a display which displays the image captured by the camera; and
   a controller which controls the transporter, the light source, and the camera, and is configured to determine a presence or absence of the electronic component on the electronic component support based on the image captured by the camera,
   wherein the camera captures a first image when the transporter is positioned at a first position and captures a second image when the transporter is positioned at a second position different from the first position, and
   wherein the controller displays the first image and the second image together on the display.

2. The electronic component handler according to claim 1, wherein the controller displays a composite image obtained by composing the first image and the second image on the display.

3. The electronic component handler according to claim 2, wherein the light has an elongated irradiation shape, and wherein the composite image is a combination of the first image and the second image along a longitudinal direction of the elongated irradiation shape in the first image and the second image.

4. The electronic component handler according to claim 1, wherein the controller displays the first image and the second image separately side by side on the display.

5. The electronic component handler according to claim 1, wherein, in a case where the same part of the electronic component support is taken in the first image and the second image, the controller removes the same part from one of the first image or the second image and displays the images.

6. The electronic component handler according to claim 1, wherein, in a case where the same part of the electronic component support is taken in the first image and the second image, the controller removes the same part from both of the first image and the second image and displays the images.

7. The electronic component handler according to claim 1, wherein the electronic component support includes a plurality of recesses arranged in rows and columns to accommodate the electronic component therein, and wherein the first image and the second image are images respectively obtained by capturing different rows out of the rows.

8. The electronic component handler according to claim 1, wherein the controller displays the first and second images on the display prior to the controller determining the presence or absence of the electronic component.

9. The electronic component handler according to claim 1, wherein the electronic component support is a tester configured to test the electronic component placed thereon.

10. An electronic component tester comprising:
a region for accommodating an electronic component support on which an electronic component is placed;
a transporter having a first hand and a second hand for holding and transporting the electronic component;
a light source which configured to emit light toward the electronic component support and configured to adjust an emitting direction of the light;
a camera which is configured to capture an image of the electronic component support, the electronic support being irradiated with the light via a space between the first hand and the second hand;
a display which displays the image captured by the camera; and
a controller which controls the transporter, the light source, and the camera, and is configured to determine a presence or absence of the electronic component on the electronic component support based on the image captured by the camera,
wherein the camera captures a first image when the transporter is positioned at a first position and captures a second image when the transporter is positioned at a second position different from the first position,
wherein the controller displays the first image and the second image together on the display, and
wherein the electronic component support is a tester which is configured to test the electronic component placed thereon.

* * * * *